US011493532B2

(12) United States Patent
Landgraf et al.

(10) Patent No.: US 11,493,532 B2
(45) Date of Patent: Nov. 8, 2022

(54) MICROMECHANICAL SENSOR AND METHODS FOR PRODUCING A MICROMECHANICAL SENSOR AND A MICROMECHANICAL SENSOR ELEMENT

(71) Applicant: Infineon Technologies Dresden GmbH & Co. KG, Dresden (DE)

(72) Inventors: Erhard Landgraf, Dresden (DE); Stephan Gerhard Albert, Munich (DE); Steffen Bieselt, Stadt Wehlen (DE); Sebastian Pregl, Dresden (DE); Matthias Rose, Kirchseeon (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 195 days.

(21) Appl. No.: 16/997,218

(22) Filed: Aug. 19, 2020

(65) Prior Publication Data

US 2020/0379004 A1  Dec. 3, 2020

Related U.S. Application Data

(62) Division of application No. 16/018,169, filed on Jun. 26, 2018, now Pat. No. 10,852,319.

(30) Foreign Application Priority Data

Jun. 29, 2017 (DE) .................. 10 2017 211 080.5

(51) Int. Cl.
*G01P 15/125* (2006.01)
*G01L 9/12* (2006.01)
(Continued)

(52) U.S. Cl.
CPC .......... *G01P 15/125* (2013.01); *B81B 3/0021* (2013.01); *B81B 3/0086* (2013.01);
(Continued)

(58) Field of Classification Search
CPC ............... G01P 15/125; G01P 15/0802; G01P 2015/088; G01P 2015/0805;
(Continued)

(56) References Cited

U.S. PATENT DOCUMENTS 5,465,604 A * 11/1995 Sherman ............... B81C 99/004
73/1.38
2004/0226375 A1 * 11/2004 Suzuki .................. G01P 15/125
73/514.32

(Continued)

FOREIGN PATENT DOCUMENTS

| DE | 19960094 | * | 7/2001 |
| DE | 103 11 076 | * | 11/2003 |
| EP | 1702884 | * | 2/2012 |

*Primary Examiner* — Robert R Raevis
(74) *Attorney, Agent, or Firm* — Harrity & Harrity, LLP

(57) ABSTRACT

A method produces a micromechanical sensor element having a first electrode and a second electrode, wherein electrode wall surfaces of the first and the second electrodes are situated opposite one another in a first direction and form a capacitance, wherein one of the first electrode or the second electrode is movable in a second direction, in response to a variable to be detected, and a second one of the first electrode and the second electrode is fixed. The method includes producing a cavity in a semiconductor substrate, the cavity being closed by a doped semiconductor layer; producing the first and the second electrodes in the semiconductor layer, including modifying the electrode wall surface of the first electrode in order to have a smaller extent in the second direction than the electrode wall surface of the second electrode.

2 Claims, 32 Drawing Sheets

(51) Int. Cl.
  *B81B 3/00* (2006.01)
  *B81C 1/00* (2006.01)
  *G01P 15/08* (2006.01)

(52) U.S. Cl.
  CPC ............ *B81C 1/00166* (2013.01); *G01L 9/12* (2013.01); *G01P 15/0802* (2013.01); *B81B 2201/0235* (2013.01); *B81B 2203/0315* (2013.01); *B81B 2203/04* (2013.01); *G01P 2015/088* (2013.01)

(58) Field of Classification Search
  CPC ........ G01P 2015/0808; G01P 201/0811; G01P 15/0891; G01L 9/12; B81B 3/0086; B81B 3/0021; B81B 2201/0235; B81B 2203/0315; B81B 2203/04; B81B 2201/0264; B81C 1/00166
  USPC ....... 73/514.32, 651–653, 24.01, 24.06, 765, 73/777, 780, 718, 724
  See application file for complete search history.

(56) References Cited

U.S. PATENT DOCUMENTS

| | | | |
|---|---|---|---|
| 2006/0211161 A1* | 9/2006 | Christenson | G01P 15/0802 438/44 |
| 2010/0313660 A1* | 12/2010 | Nishikage | G01P 15/0802 73/514.32 |
| 2015/0198493 A1* | 7/2015 | Kaelberer | B81B 3/0037 73/718 |
| 2017/0003314 A1* | 1/2017 | Waters | G01P 15/097 |
| 2017/0363656 A1* | 12/2017 | Fang | G01P 15/125 |

* cited by examiner

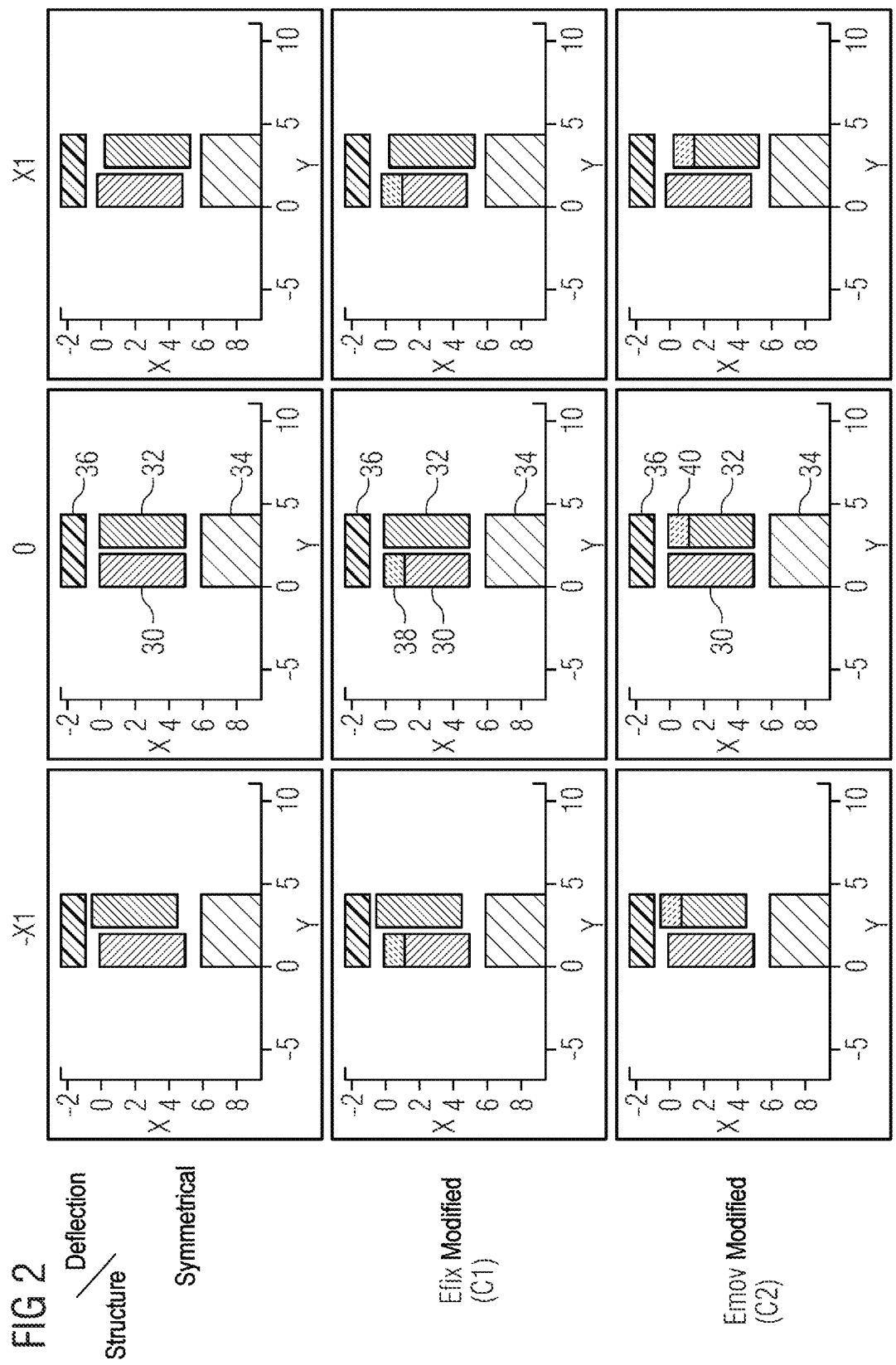

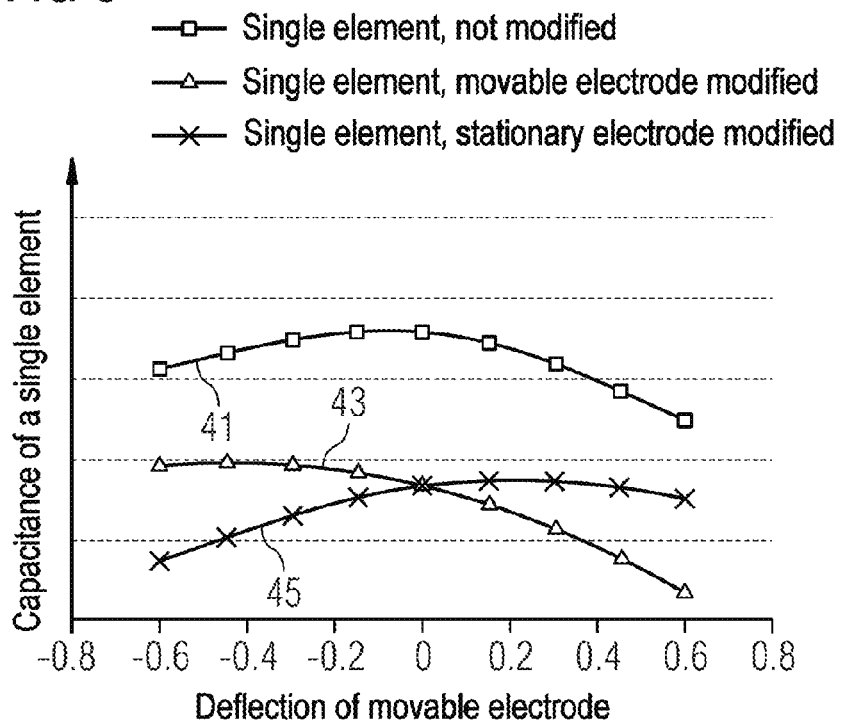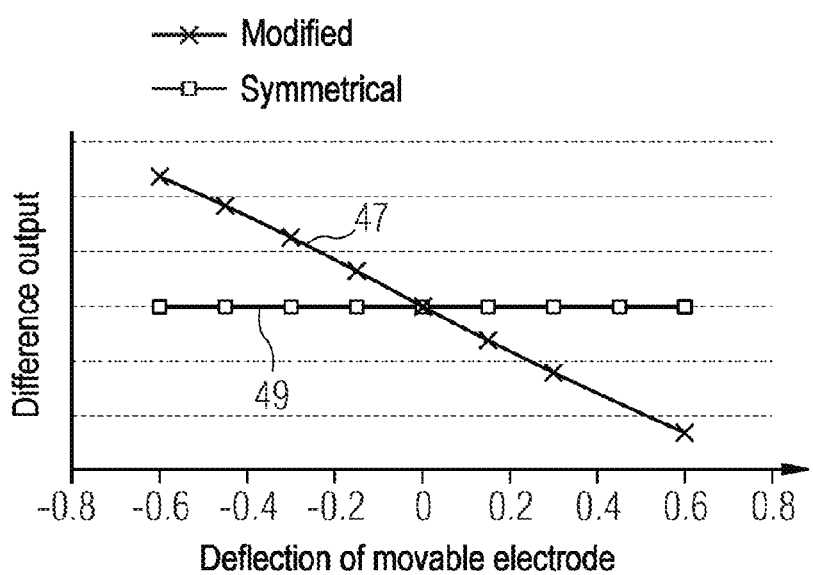

$$v\_out = \sim -(v1C1 + v2C2) / C\_feedback = -v1 * (C1-C2) / C\_feedback$$

$$v\_out = v\_in \times (C1-C2) / C\_feedback$$

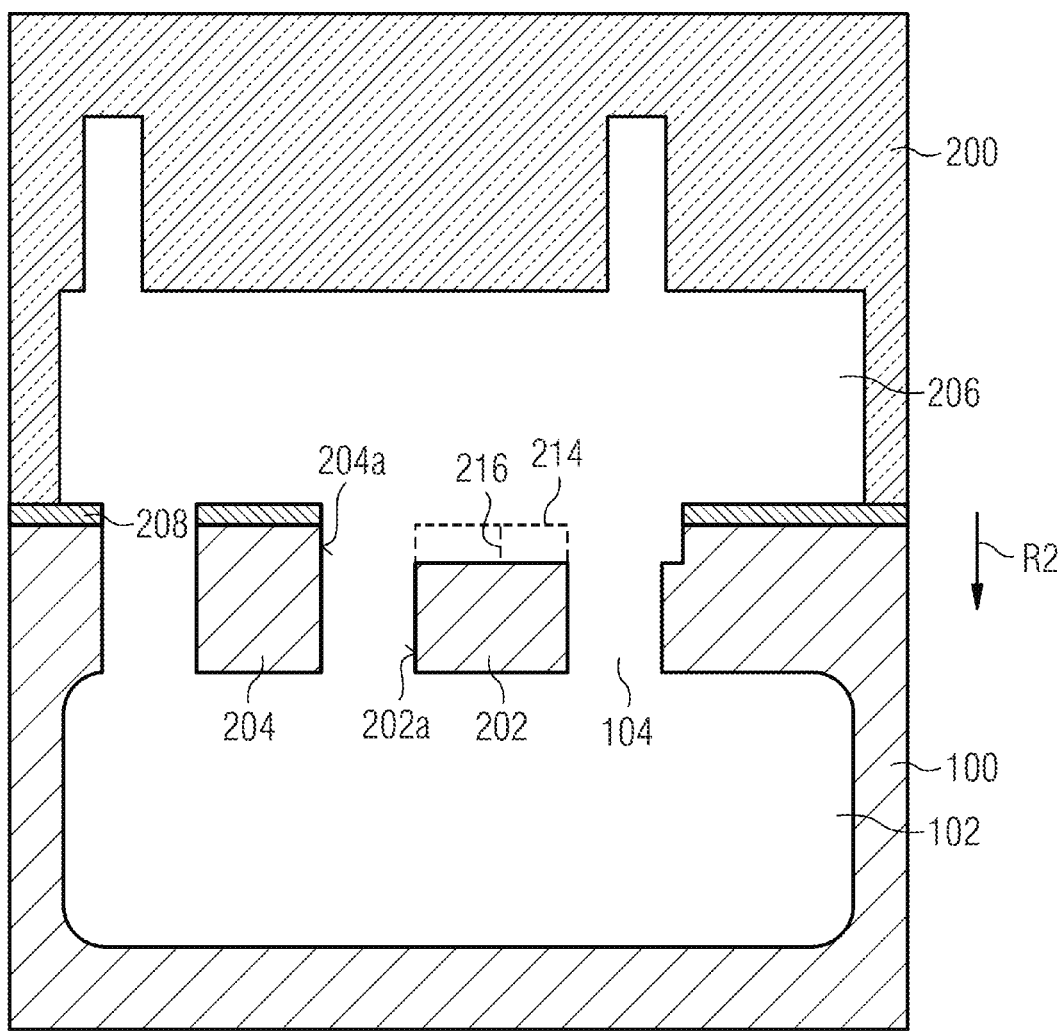

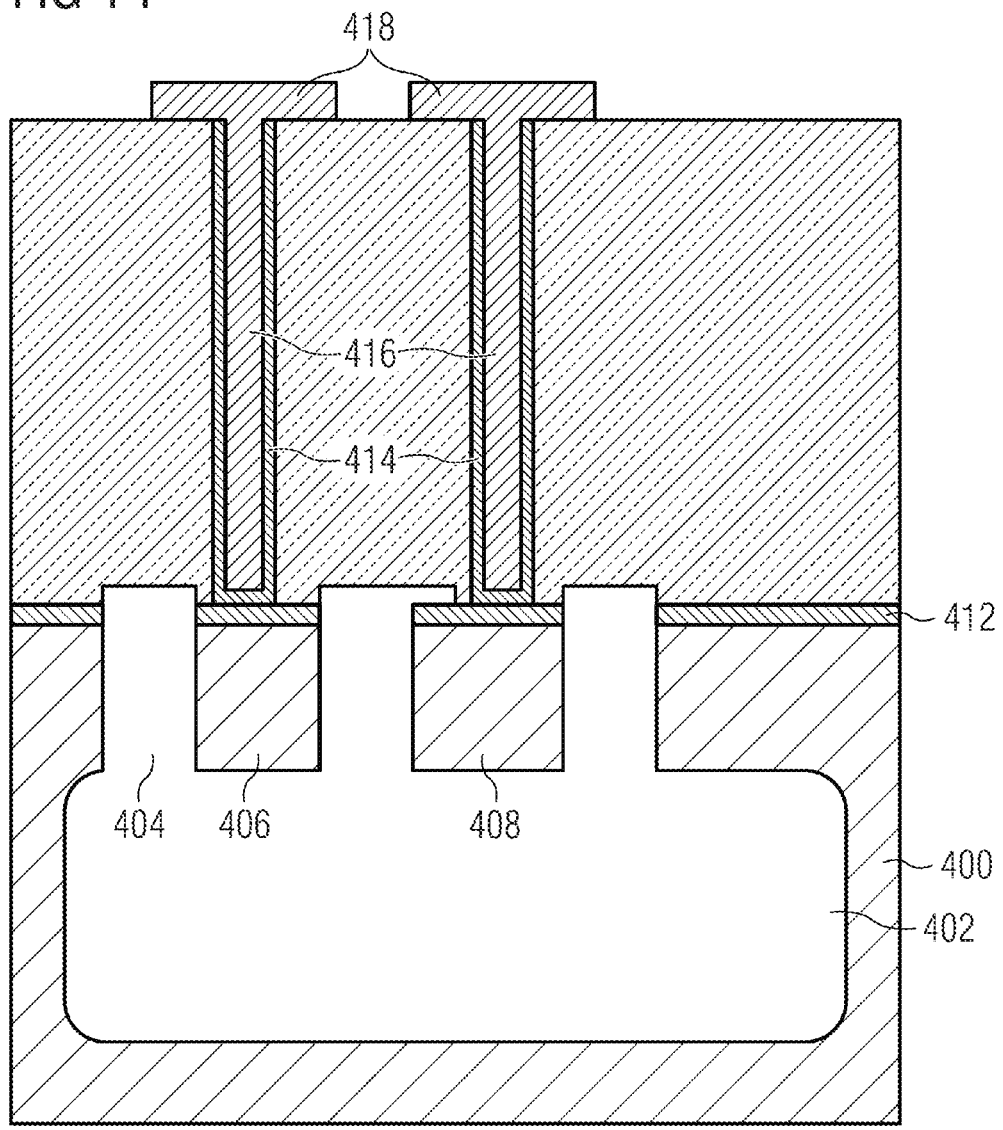

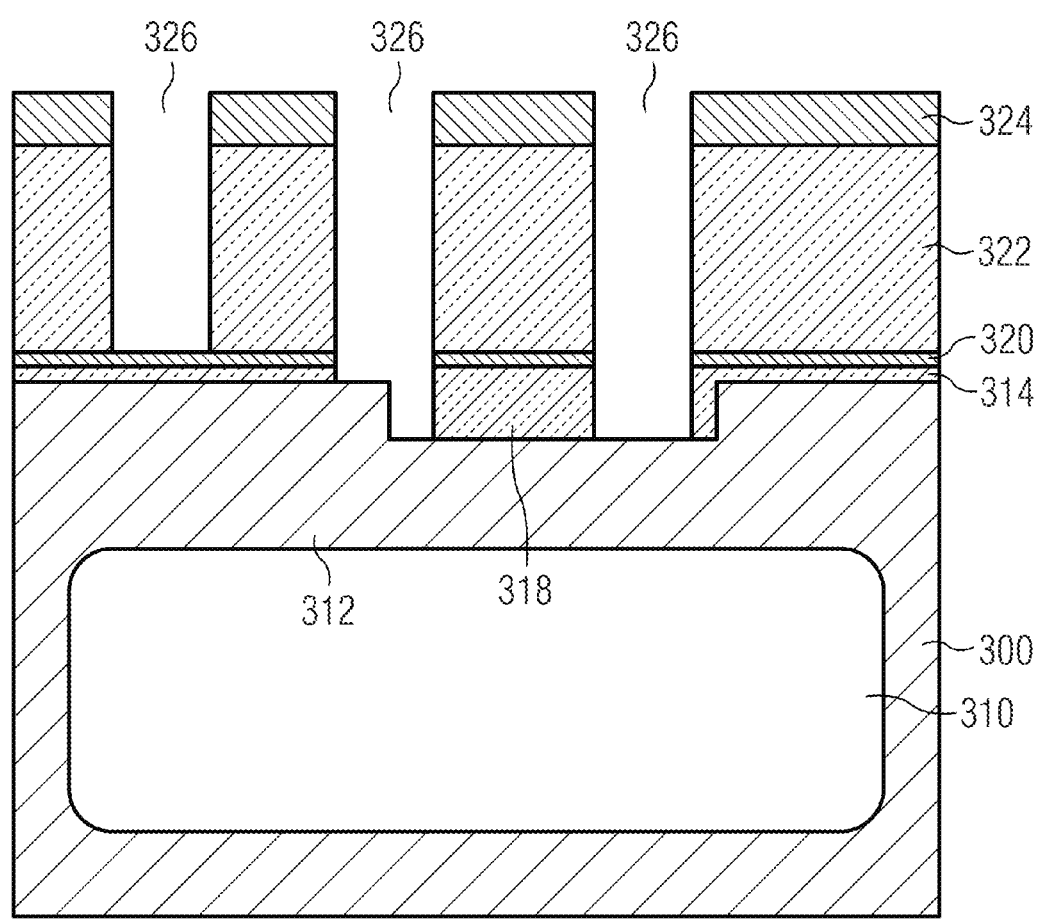

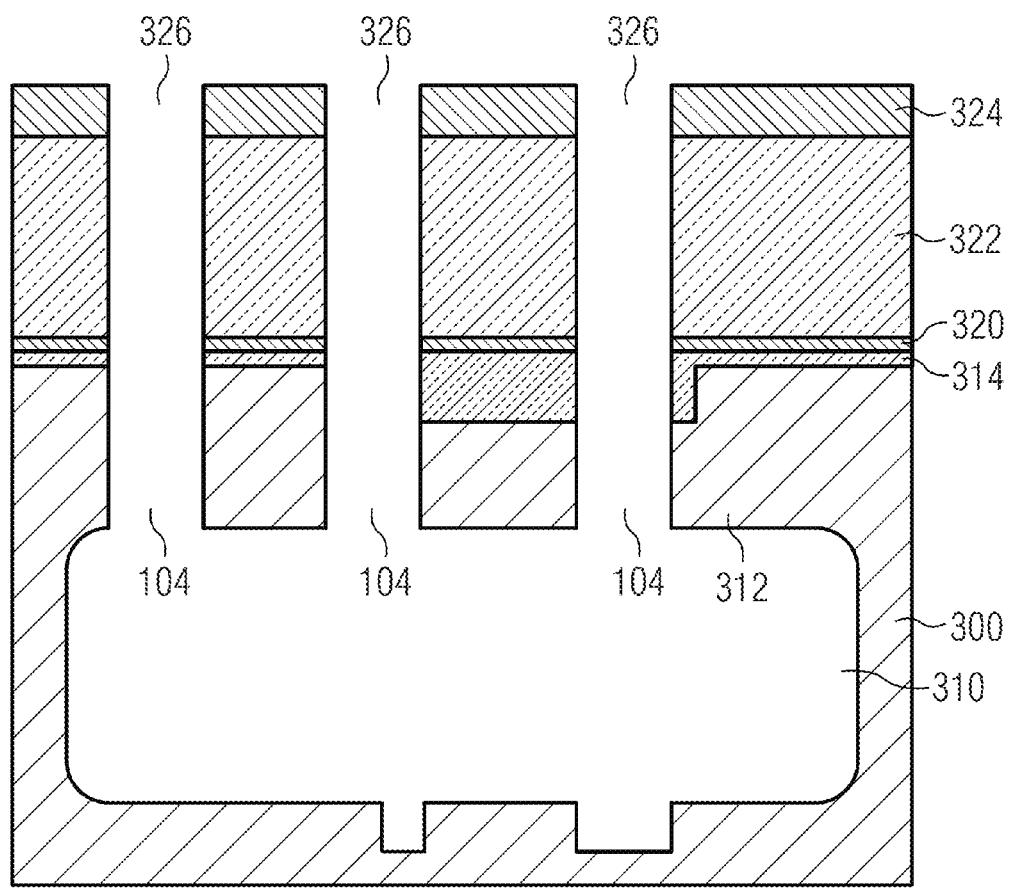

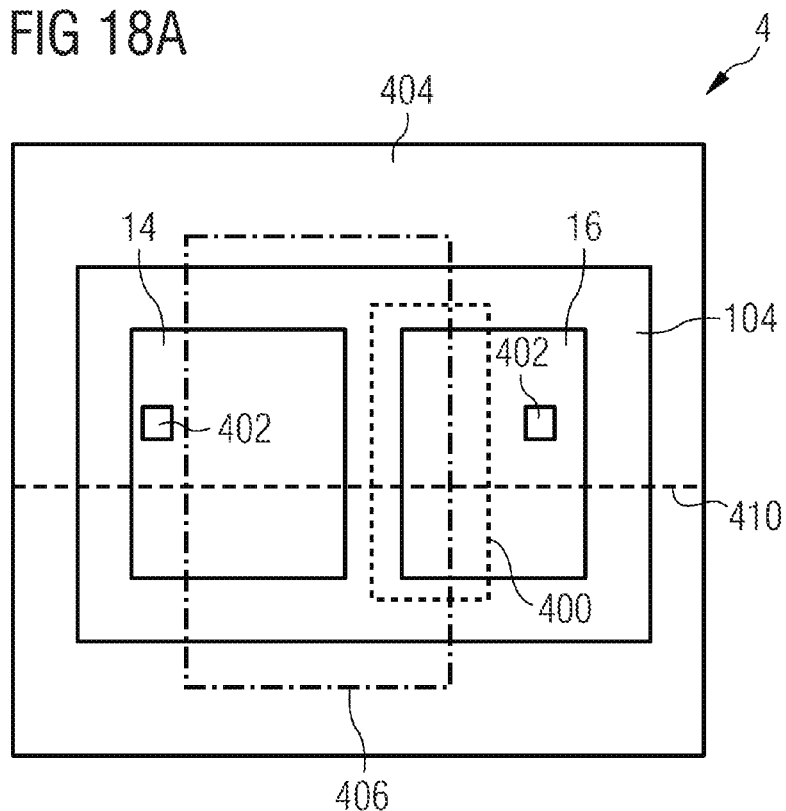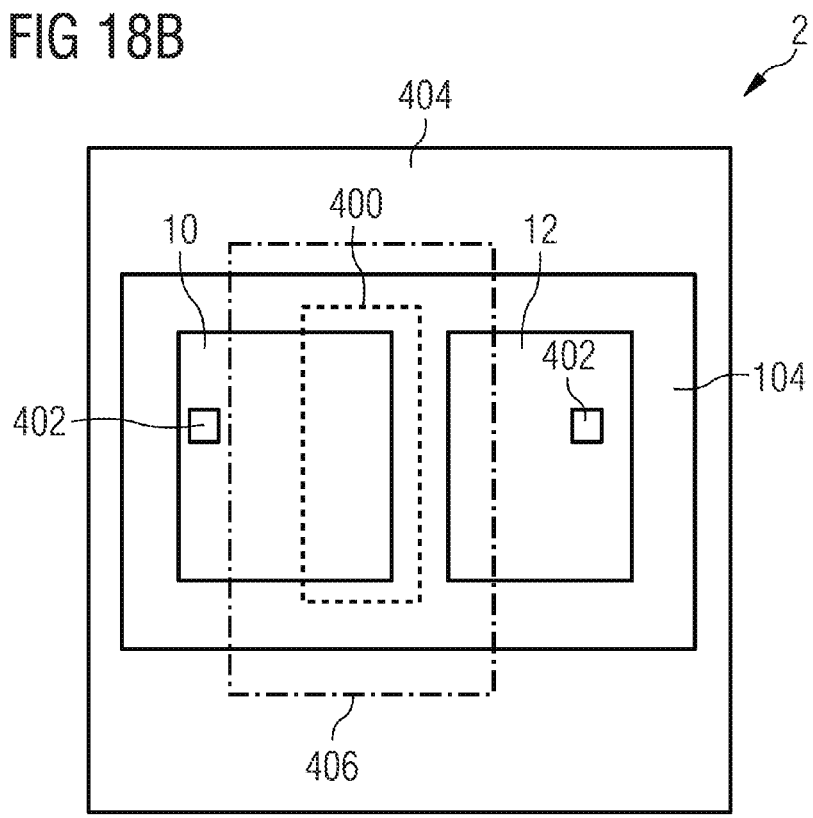

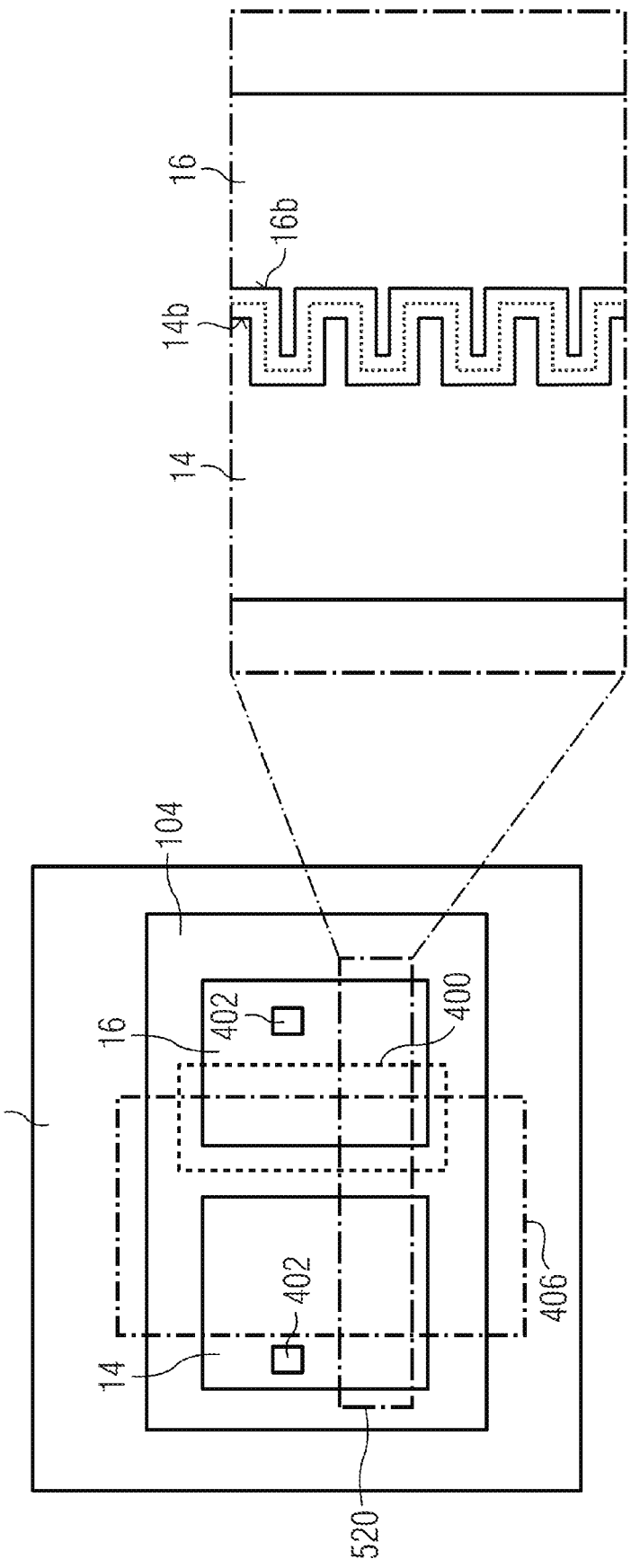

MICROMECHANICAL SENSOR AND METHODS FOR PRODUCING A MICROMECHANICAL SENSOR AND A MICROMECHANICAL SENSOR ELEMENT

CROSS-REFERENCE TO RELATED APPLICATIONS

This application is a division of U.S. patent application Ser. No. 16/018,169 filed Jun. 26, 2018, which claims the benefit of German Patent Application No. 10 2017 211 080.5 filed Jun. 29, 2017, which are incorporated by reference as if fully set forth.

FIELD

The present disclosure relates to micromechanical sensors, micromechanical sensor elements, and methods for producing same. In particular, the present disclosure relates to sensors and sensor elements having at least one electrode which is movable in response to a variable to be detected, for example, a pressure or an acceleration.

BACKGROUND

Piezoresistive sensors or capacitive sensors can be used for acceleration detection or pressure detection.

In the case of piezoresistive sensors, beams bend in response to a pressure or an acceleration, as a result of which an electrical resistance of the beams changes. The corresponding change in resistance can be detected in order to deduce on the basis thereof the variable to be detected, for example the pressure or the acceleration.

Capacitive sensor elements have capacitances, at least one electrode of which is movable. A movement of the movable electrode can be brought about by a variable to be detected, for example a pressure or an acceleration, which in turn results in a change in capacitance that can be detected in order to deduce the variable to be detected.

For signal detection, corresponding sensor elements can be interconnected in Wheatstone bridges. Wafer technologies can be used to produce movable structures of the sensor elements by micromachining. Wafer bonding can be used to achieve an encapsulation of the corresponding structures on the front side and the rear side and hence sufficient robustness.

Capacitive acceleration sensors can be designed to detect an acceleration out of plane. In this case, a movable test mass can be anchored with a stationary substrate by means of an anchor, wherein electrodes are formed both on the test mass and on the stationary substrate, said electrodes forming two capacitors on two sides of the anchor. As a reaction to an acceleration out of plane, the test mass inclines relative to its rotation axis, which changes the capacitances of the two capacitors. This imbalance can be detected in order to detect the acceleration out of plane.

SUMMARY

Micromechanical sensors and micromechanical sensor elements having improved characteristics would be desirable.

Examples of the present disclosure provide a micromechanical sensor including a first and a second capacitive sensor element each having a first and a second electrode, wherein electrode wall surfaces of the first electrode and the second electrode are situated opposite one another in a first direction and form a capacitance, wherein the first electrodes are movable in a second direction, which is different than the first direction, in response to a variable to be detected, and the second electrodes are stationary. The electrode wall surface of the first electrode of the first sensor element has a smaller extent in the second direction than the opposite electrode wall surface of the second electrode of the first sensor element. The electrode wall surface of the second electrode of the second sensor element has a smaller extent in the second direction than the opposite electrode wall surface of the first electrode of the second sensor element.

Examples of the present disclosure provide a method for producing a micromechanical sensor, wherein a first and a second capacitive sensor element are produced, each having a first and a second electrode, wherein electrode wall surface of the first electrode and the second electrode are situated opposite one another in a first direction and form a capacitance, wherein the first electrodes are movable in a second direction, which is different than the first direction, in response to a variable to be detected, and the second electrodes are stationary. In this case, the electrode wall surface of the first electrode of the first sensor element is produced with an extent in the second direction which is smaller than an extent of the opposite electrode wall surface of the second electrode of the first sensor element in the second direction. The electrode wall surface of the second electrode of the second sensor element is produced with an extent in the second direction which is smaller than an extent of the opposite electrode wall surface of the first electrode of the second element in the second direction.

Examples of the present disclosure provide a method for producing a micromechanical sensor element having a first and a second electrode, wherein electrode wall surfaces of the first and second electrodes are situated opposite one another in a first direction and form a capacitance, wherein the first electrode is movable in a second direction, which is different than the first direction, in response to a variable to be detected, and the second electrode is stationary. In this case, a cavity is produced in a semiconductor substrate, said cavity being closed by a doped semiconductor layer. Both electrodes of the capacitive sensor element are produced in the semiconductor layer, wherein the electrode wall surface of one of the two electrodes is modified in order to have a smaller or larger extent in the second direction than the opposite electrode wall surface of the other of the two electrodes.

BRIEF DESCRIPTION OF THE DRAWINGS

Examples of the disclosure are described below with reference to the accompanying drawings, in which:

FIG. 2 shows schematic illustrations of examples of capacitive sensor elements in which electrodes are modified differently.

FIG. 3 shows schematic illustrations of simulation results of the exemplary structures of capacitive sensor elements shown in FIG. 2.

FIG. 12 shows a schematic illustration of one example of a capacitive sensor element having an electrode modified by a cutout.

FIG. 14 shows a schematic sectional view for elucidating one example of a method for producing contacts through an oxide layer.

FIGS. 15A to 15I show schematic sectional views for elucidating one example of a method for producing a capacitive sensor element having an electrode modified by an insulator.

FIGS. 18A and 18B show schematic plan views of examples of a first sensor element having a modified stationary electrode and of a second sensor element having a modified movable electrode.

FIGS. 20A and 20B show schematic plan views for elucidating one example of a capacitive sensor element having interdigital electrodes.

DETAILED DESCRIPTION

Examples of the present disclosure are described below in detail and using the accompanying drawings. It should be pointed out that identical elements or elements having the same functionality are provided with identical or similar reference signs, a repeated description of elements that are provided with the same or similar reference signs typically being omitted. Descriptions of elements having identical or similar reference signs are mutually interchangeable. In the following description, many details are described in order to provide a more thorough explanation of examples of the disclosure. However, it is evident to those skilled in the art that other examples can be implemented without these specific details. Features of the various examples described can be combined with one another, unless features of a corresponding combination are mutually exclusive or such a combination is expressly precluded.

Figure 1A:
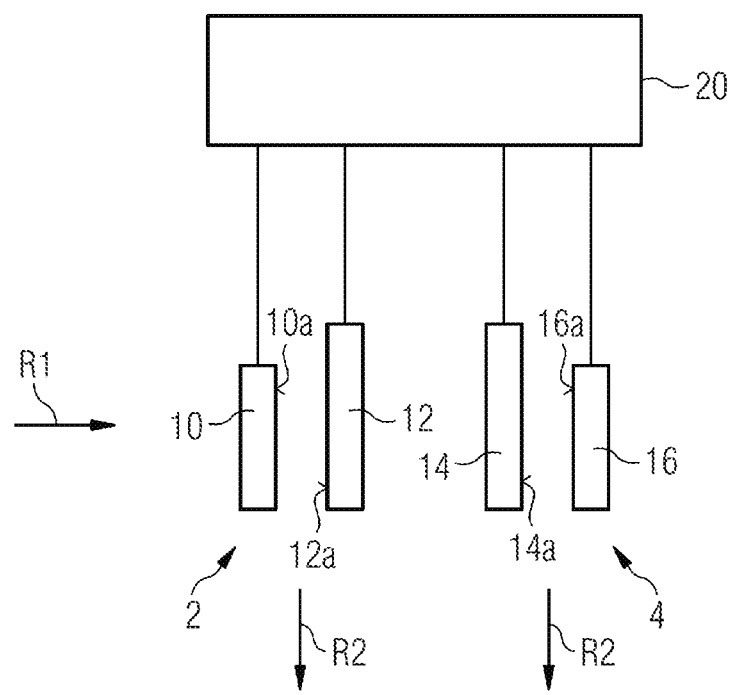
FIGS. 1A and 1B show schematic illustrations of one example of a micromechanical sensor.

FIG. 1A schematically shows a sectional view of a first capacitive sensor element 2 and a second capacitive sensor element 4. The first capacitive sensor element 2 has a first electrode 10 and a second electrode 12. The second capacitive sensor element 4 has a first electrode 14 and a second electrode 16. Electrode wall surfaces 10a, 12a of the first electrode 10 and of the second electrode 12 are situated opposite one another in a first direction R1 and form a capacitance. Electrode wall surfaces 14a, 16a of the first electrode 14 and of the second electrode 16 are likewise situated opposite one another in the first direction R1 and form a capacitance. The first electrodes 10 and 14 are movable in a second direction R2, which is different than the first direction R1. The second electrodes 12 and 16 are stationary.

In examples, the first electrodes 10 and 14 can be mounted movably on a carrier and the second electrodes 12 and 16 can be mounted in a stationary manner on the carrier. The carrier can be a substrate, for example. The electrodes can be formed for example on or in a substrate, wherein the first direction R1 is parallel to a substrate plane, and the second direction is perpendicular to the substrate plane. In this case, the substrate plane can be a plane that is parallel to the main surfaces of the substrate. In this case, a substrate can be understood to mean a body having two mutually opposite main surfaces connected by respective side surfaces. In this case, the main surfaces are the surfaces of the substrate which have a larger area than the side surfaces. In examples, the substrate can be a semiconductor substrate, such as e.g. a silicon substrate. The movable electrodes can be mounted in a resilient manner on the substrate and can be movable, i.e. deflectable, from a rest state into a deflected state in response to a force. Once the force action ends, the movable electrodes can return to the rest state again by virtue of the resilient mounting. The movable electrodes can thus be deflected in response to an out of plane force, that is to say a force that acts perpendicularly to the substrate plane.

In examples of the present disclosure, the electrodes having the mutually opposite electrode wall surfaces can be implemented in any desired manner. In examples, the electrodes can be formed by doped semiconductor regions of a substrate. In examples, the electrodes can be formed in a semiconductor substrate, such as e.g. a silicon substrate, which has a doping of $>5 \times 10^{17}$. In other examples, the electrodes can be formed from some other conductive material, for example metal. In examples, the electrodes can be formed by conductive coatings on an insulating material.

Figure 1B:
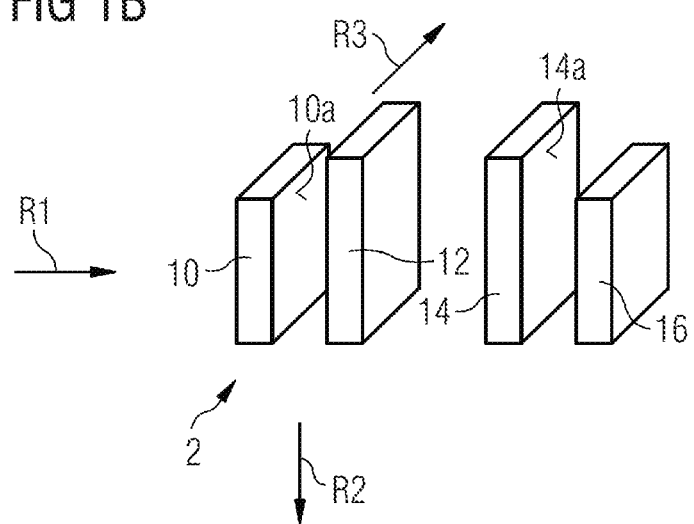

The electrode wall surfaces 10a, 12a, 14a and 16a can be planar and arranged in a plane that is perpendicular to the first direction R1 and parallel to the second direction R2, that is to say in a plane that is defined by the second direction R2 and a third direction R3, which is perpendicular to the first direction R1 and the second direction R2. In examples, said plane in which the electrode wall surfaces are arranged can be perpendicular to the substrate plane. The extent of the electrode wall surfaces in the second direction can be constant, as can be seen in FIG. 1B.

The electrode wall surface 10a of the first electrode 10 of the first sensor element 2 has a smaller extent in the second direction R2 than the opposite electrode wall surface 12a of the second electrode 12 of the first sensor element 2. The electrode wall surface 16a of the second electrode 16 of the second sensor element 4 has a smaller extent in the second direction R2 than the opposite electrode wall surface 14a of the first electrode 14 of the second sensor element 4.

As is indicated in FIG. 1A, the electrodes 10, 12, 14 and 16 can be electrically connected to an evaluation circuit 20. The evaluation circuit 20 can be designed to detect the capacitances of the first capacitive sensor element 2 and of the second capacitive sensor element 4. Using the detected capacitances, it is then possible to deduce a variable to be detected which brings about a movement of the movable electrodes 10 and 14 in the direction R2 or counter to the direction R2. Such a movement of the movable electrodes 10 and 14 relative to the stationary electrodes 12 and 16 brings about a change in capacitance of at least one of the capacitive sensor elements, which is in turn detectable.

In examples, the electrode wall surface 10a of the first electrode 10 of the first sensor element 2 can have the same extent in the second direction R2 as the electrode wall surface 16a of the second electrode 16 of the second sensor element 4. The electrode wall surface 12a of the second electrode of the first sensor element 2 can have the same extent in the second direction R2 as the electrode wall surface 14a of the first electrode 14 of the second sensor element 4.

In examples, the mutually opposite electrode wall surfaces 10a and 12a of the first and second electrodes 10 and 12 of the first sensor element 2 can have the same extent in the direction R3. In examples, the mutually opposite electrode wall surfaces 14a and 16a of the first and second electrodes 14 and 16 of the second sensor element 4 can have the same extent in the direction R3. In examples, all electrodes can have the same extent in the direction R3.

In examples, first ends of the electrode wall surfaces of the electrodes 10, 12, 14 and 16 can extend in the direction R2 as far as a common first plane. Second ends of the electrode wall surfaces 10a and 16a situated opposite the first ends can extend as far as a second plane, which is parallel to the first plane. Second ends of the electrode wall surfaces 12a and 14a situated opposite the first ends can extend as far as a third plane, which is parallel to the first and second planes, and which is spaced apart from the first plane further than the second plane.

The first electrodes 10 and 14 are movable in the direction R2 that is different than the direction R1. The direction R2 can be perpendicular to the direction R1. The direction R1 can be parallel to the substrate plane and the direction R2 can be perpendicular to the substrate plane. In examples, the movement of the electrodes can have components in other directions besides the principal component in the second direction R2, as long as the component of the movement in the second direction is the largest component.

Examples of the present disclosure use a capacitive out-of-plane detection principle with an electrode system of mutually laterally opposite conductor structures, i.e. conductive electrodes. In this case, the expression "out of plane" can relate to the substrate plane, and the expressions "lateral (ly)" and "vertical(ly)" can likewise relate to the arrangement relative to the substrate plane. Under the action of a force that is intended to be detected, the electrodes of a capacitive sensor element can experience a displacement of the vertical position relative to one another, which leads to a corresponding change in the capacitance between the electrodes of the capacitive sensor element. It has been recognized that the general characteristic of such a capacitive sensor element can be more or less nonlinear or can even have a maximum in an input range of interest, which can lead to ambivalent results.

Examples of the present disclosure provide a micromechanical sensor that uses two capacitive sensor elements in order to obtain an output signal having a more linear characteristic than a single capacitive sensor element. Examples of the present disclosure are geared toward attaining an approximately linear differential change in capacitance with the input signal, i.e. [$\Delta$C1(signal)−$\Delta$C2(signal)]/$\Delta$signal=constant. In this case, C1(signal) represents the capacitance of the first capacitive sensor element 2, said capacitance being dependent on the signal to be detected, and C2(signal) represents the capacitance of the second capacitive sensor element 4, said capacitance being dependent on the signal to be detected. The symbol $\Delta$ represents the change in the respective variable.

For this purpose, in examples, in one of the capacitive sensor elements, the movable electrode can have an electrode wall surface which has a smaller extent in the second direction than the opposite electrode wall surface of the stationary electrode and, in the other capacitive sensor element, the stationary electrode can have an electrode wall surface which has a smaller extent in the second direction than the electrode wall surface of the opposite movable electrode. The capacitive elements can thus be suitably modified in order to obtain a more linear output signal dependent on the input signal.

By means of a modification of a respective electrode in each sensor element in order to bring about different extents of mutually opposite electrode surfaces in the direction of movement, it is thus possible to introduce an asymmetry into an otherwise symmetrical vertical, geometric and electrical profile. In one sensor element the modified electrode is movable, and in the other sensor element the modified electrode is stationary.

This behavior was shown on the basis of a simulation. FIG. 2 schematically shows capacitive sensor elements, wherein the middle column shows the respective sensor element in the rest state, i.e. for a deflection of 0. The left-hand column shows the respective sensor element for a deflection −$x_1$ of the movable electrode counter to the direction R2, while the right-hand column shows the respective sensor element for a deflection $x_1$ of the movable electrode in the direction R2.

The sensor elements shown in FIG. 2 each have a stationary electrode 30 and a movable electrode 32, between which a capacitance is formed. Furthermore, schematic sections of a substrate 34 and of a covering 36 of the respective sensor element are shown in FIG. 2. The first row shows in each case a capacitive sensor element in which the opposite electrode wall surfaces of the first and second electrodes 30 and 32 have an identical extent in the second direction. The electrodes are thus symmetrical in this case. In the middle row in FIG. 2, the stationary electrode 30 has a smaller extent in the second direction, which is indicated by an insulating region 38. In examples, the stationary electrode (Efix) can be modified for this purpose. In the bottom row in FIG. 2, the movable electrode 32 has a smaller extent in the second direction R2, which is indicated by an insulating region 40. In examples, the movable electrode (Emov) can be modified for this purpose.

As is shown in the left-hand column and the right-hand column in FIG. 2, a force acting on the movable electrode 32 brings about a deflection −$x_1$ counter to the second direction R2 or a deflection $x_1$ in the second direction R2. In examples, such a force can be brought about by a variable to be detected, such as, for example, a pressure or an acceleration. The results of a two-dimensional simulation of the capacitance between the mutually opposite electrodes of the capacitive sensor elements from FIG. 2 is shown in FIG. 3. The upper region of FIG. 3 here illustrates in each case the capacitance of a single capacitive element, wherein curve 41 shows the characteristic of a single, non-modified element, curve 43 shows the characteristic of a single element in which the movable electrode is modified, and curve 45 shows the characteristic of a single element in which the stationary electrode was modified. The capacitance is plotted here in each case against the deflection of the movable electrode. The lower part of FIG. 3 shows the difference signal of two capacitive sensor elements. Curve 47 shows the difference between two symmetrical sensor elements, such that the difference output is 0. Curve 49 shows the difference between a first capacitive sensor element, in which the movable electrode is modified, and a second sensor element, in which the stationary electrode is modified. Curve 49 shows that a substantially linear differential change in capacitance can be attained. FIG. 3 furthermore shows that it is possible to attain a linear characteristic over a large range and specifically in both deflection directions proceeding from the force-free rest state.

In examples of the present disclosure, a micromechanical sensor has an evaluation circuit configured to output an output signal which is proportional to the difference between the capacitances of the first and second capacitive sensor elements.

Figure 4:
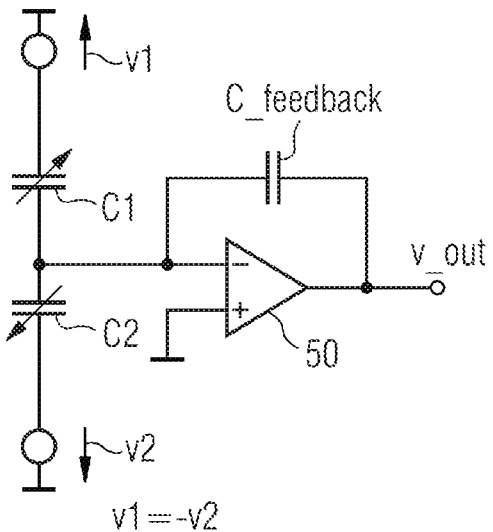
FIG. 4 shows an illustration of one example of a half-bridge evaluation circuit.

In examples, the evaluation circuit can have a half-bridge circuit, wherein the first and second sensor element are interconnected in the half-bridge circuit. One example of such a half-bridge circuit is shown in FIG. 4, wherein C2 represents the capacitance of a capacitive sensor element in which the movable electrode is modified, while C1 represents the capacitance of a sensor element in which the stationary sensor electrode is modified. v1 and v2 represent supply voltages. c_feedback represents a feedback capacitor for a differential amplifier 50. The elements are interconnected in the manner shown in FIG. 4 in order to obtain the output signal v_out at the output of the differential amplifier 50. FIG. 4 furthermore shows how the output signal can be calculated from the indicated variables in the case of the half-bridge circuit shown.

Figure 5:
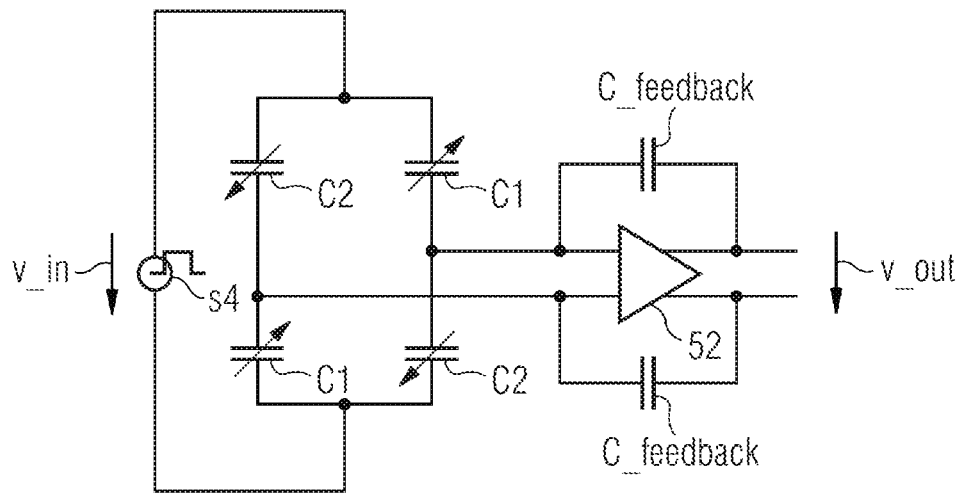
FIG. 5 shows an illustration of one example of a full-bridge evaluation circuit.

In examples of the present disclosure, the micromechanical sensor can have two corresponding first capacitive sensor elements and two corresponding second capacitive sensor elements, wherein the evaluation circuit can have a full-bridge circuit, and wherein the first and second sensor elements can be interconnected in the full-bridge circuit. One example of such a full-bridge circuit is shown in FIG. 5. Two capacitive sensor elements having a modified movable electrode, which have respective capacitances C2, and two capacitive sensor elements having a modified stationary electrode, which have respective capacitances C1, are connected to the inputs of a differential amplifier 52 having a differential output v_out in the manner shown in FIG. 5. Two feedback capacitors c_feedback are interconnected in the manner shown. A signal source 54 supplies a rectangular input voltage v_in. FIG. 5 furthermore indicates how the output signal v_out can be calculated from the given variables in the case of the full-bridge circuit shown. Additional common-mode rejection can be achieved through the use of a full-bridge configuration.

Referring to FIGS. 6 to 9, examples in which the electrodes are formed by doped semiconductor regions of a substrate are described below.

Figure 6A:
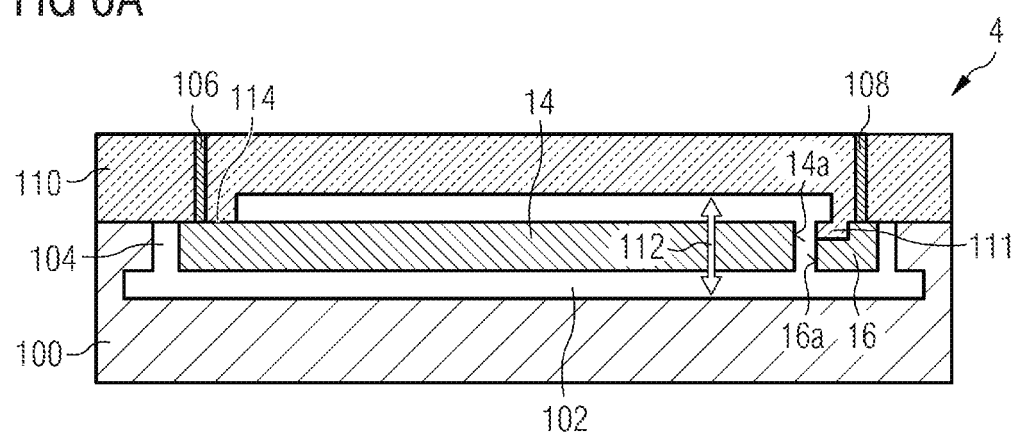
FIGS. 6A and 6B show schematic sectional views of examples of first and second capacitive sensor elements having dielectrically isolated electrodes.
Figure 6B:
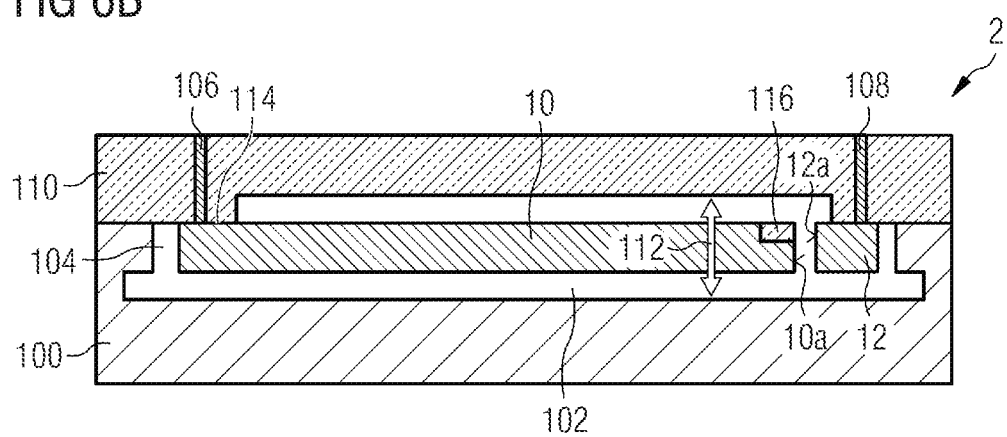
Figure 9A:
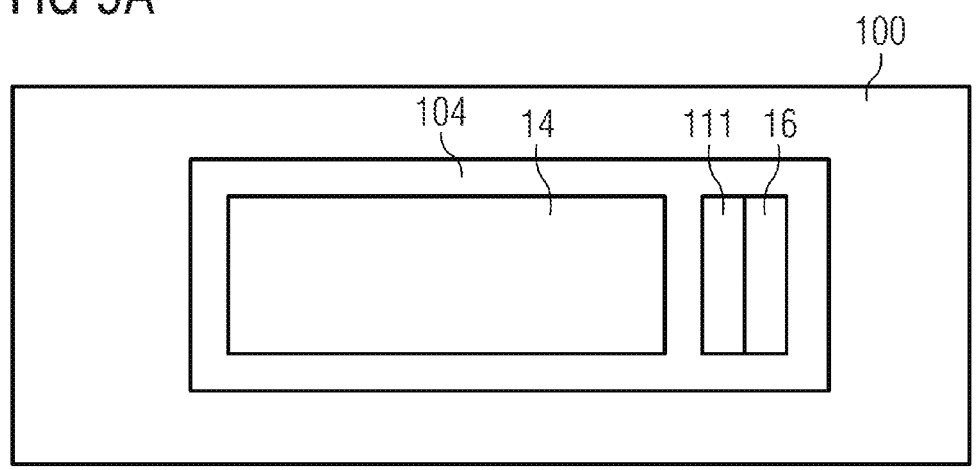
FIGS. 9A and 9B show schematic plan views of examples of substrates of a first and a second capacitive sensor element in accordance with FIGS. 6A and 6B.
Figure 9B:
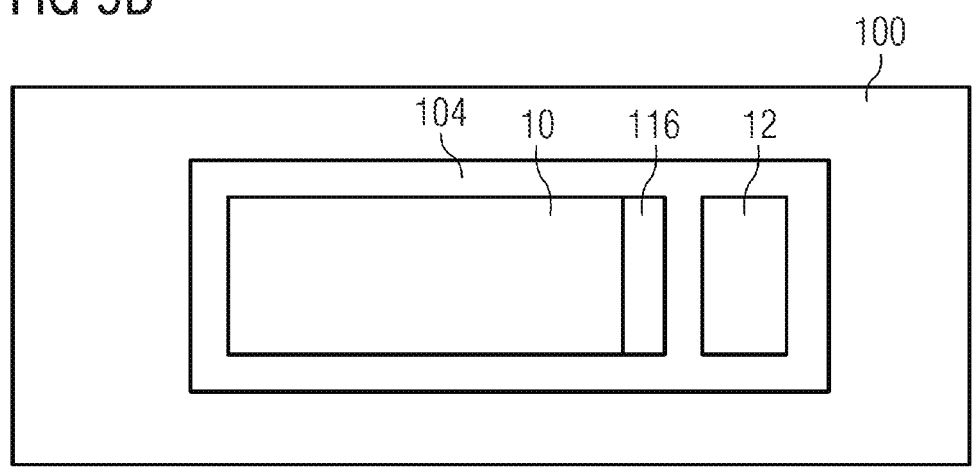

FIGS. 6A and 6B show schematic cross-sectional views of capacitive sensor elements which are implemented with dielectrically isolated electrodes, FIG. 9A shows a schematic plan view of the substrate of the sensor element from FIG. 6A, and FIG. 9B shows a schematic plan view of the substrate of the sensor element from FIG. 6B.

In the sensor element shown in FIG. 6A, a movable electrode 14 and a stationary electrode 16 are structured in a semiconductor substrate 100. The semiconductor substrate 100 can be at least partly doped, such that the electrodes 14 and 16 are conductive. The substrate 100 has a buried cavity 102 and trenches 104, which define the electrodes 14 and 16. In this case, FIG. 9A shows a possible course of the trenches defining the electrodes 14 and 16. An insulating layer 110 is provided on a main surface of the substrate 100. The movable electrode 14 and the stationary electrode 16 are applied to the insulating layer 110. Consequently, the movable electrode 14 and the stationary electrode 16 are insulated from one another by the trenches 104, the buried cavity 102 and the insulating layer 110. The insulating layer 110 can consist of a dielectric such as e.g. an oxide. Furthermore, the capacitive sensor element has a contact 106 for the movable electrode 14 and a contact 108 for the stationary electrode 16.

The stationary electrode 16 is modified in such a way that an electrode wall surface 16a thereof situated opposite an electrode wall surface 14a of the movable electrode 14 has a smaller extent perpendicular to the substrate plane than the electrode wall surface 14a. For this purpose, a section 111 of the electrode 16 is replaced by an insulating material, for example an oxide. The movable electrode is movable in response to an out of plane force, as is indicated by an arrow 112 in FIG. 6A. FIG. 6A thus shows one example of a second capacitive sensor element 4 in which the stationary electrode has a smaller extent in the direction of movement.

The trenches 104 can be designed in such a way that an elongate deflectable electrode 14 is produced, which is clamped at one end 114 and whose end at a distance from this clamped end is movable.

FIG. 6B shows a corresponding capacitive sensor element in which a substrate 100 is structured by a buried cavity 102 and trenches 104 in order to implement a movable electrode 10 and a stationary electrode 12. The movable electrode 10 is once again designed as an elongate electrode which is clamped at a first end 114 by means of the insulating layer 110 and whose second end is movable vertically with respect to the substrate plane, as is once again indicated by an arrow 112. In the capacitive sensor element shown in FIG. 6B, an electrode wall surface 10a of the movable electrode 10 has a smaller extent in the direction of movement than an electrode wall surface 12a of the stationary electrode 12. In the example shown, this is implemented by a part of the movable electrode 10 being replaced by an insulating material 116. The capacitive sensor element shown in FIG. 6B thus represents one example of a first capacitive sensor element 2 in which the movable electrode has a smaller extent in the direction of movement.

Since, in the sensor elements shown in FIGS. 6A and 6B, the movable electrode is completely surrounded by the trench 104, the stationary electrode can be mounted at the semiconductor substrate and need not be completely surrounded by the trench 104.

Figure 7A:
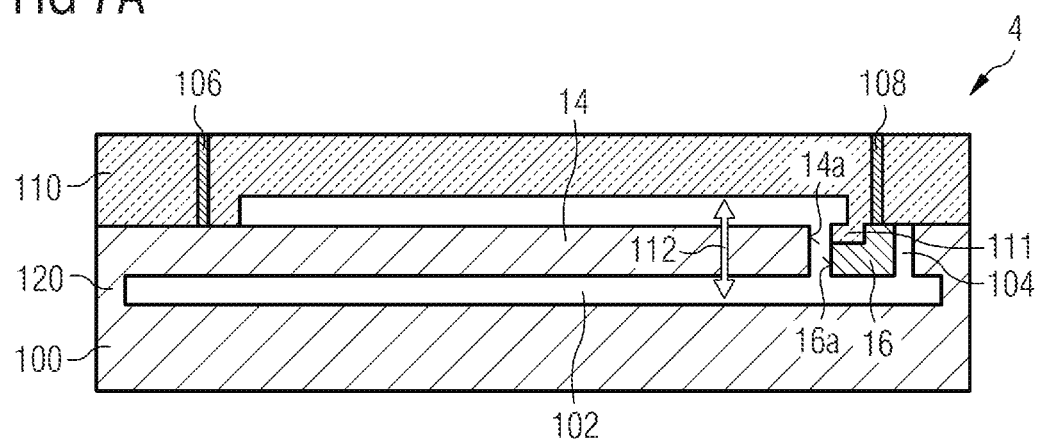
FIGS. 7A and 7B show schematic sectional views of examples of first and second capacitive sensor elements having a movable electrode suspended from a substrate.
Figure 7B:
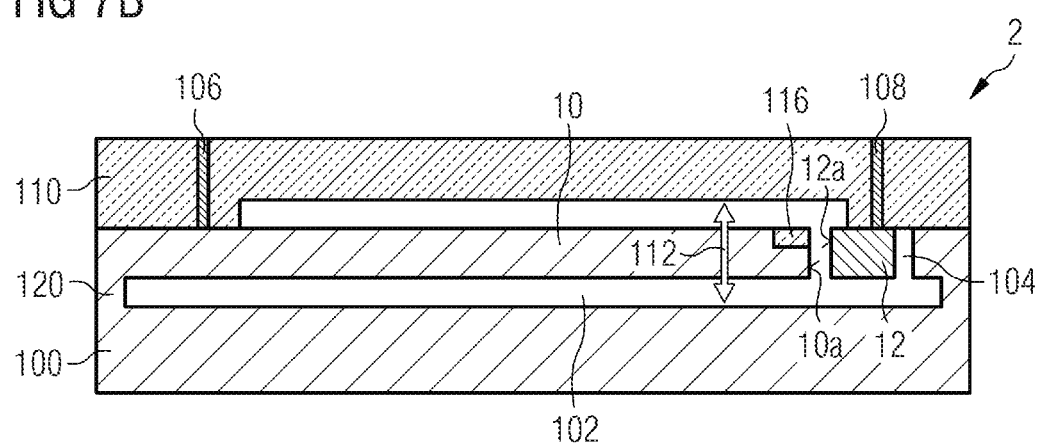
Figure 9C:
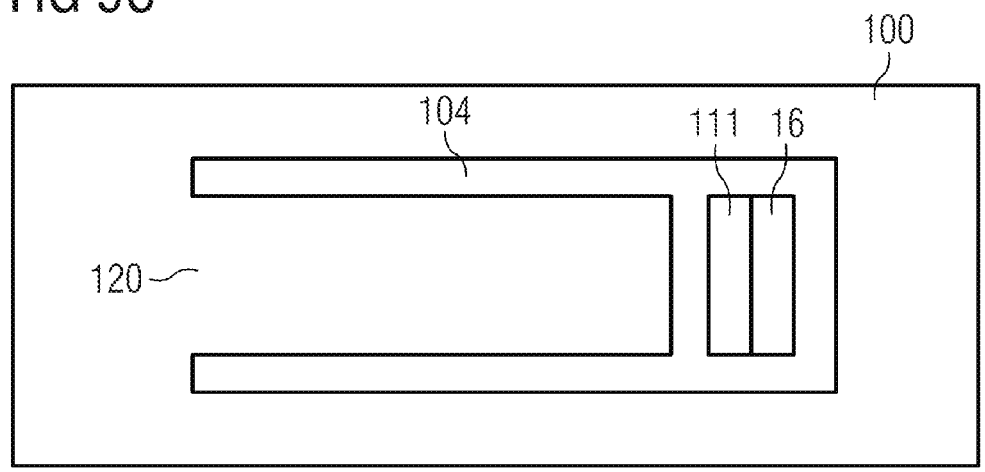
FIGS. 9C and 9D show schematic plan views of examples of substrates of a first and a second capacitive sensor element in accordance with FIGS. 7A and 7B.
Figure 9D:
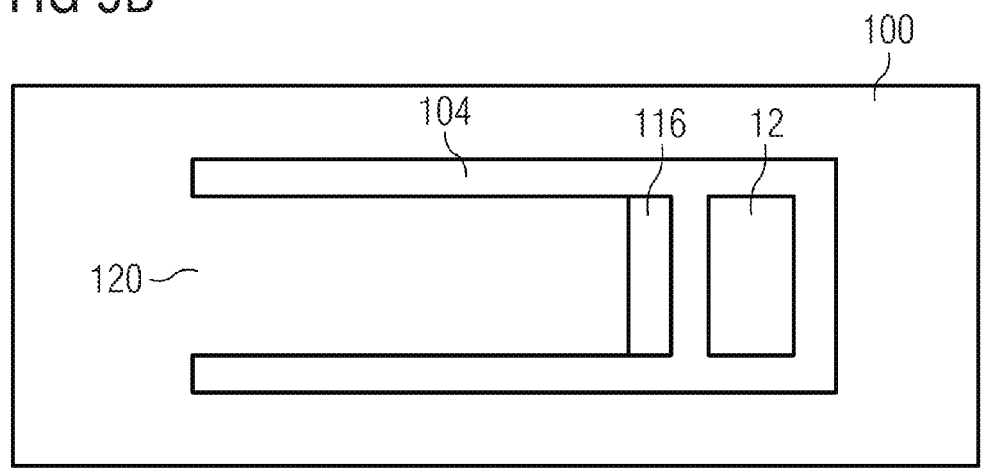

FIGS. 7A and 7B show schematic sectional views of examples of a second sensor element 4 and a first sensor element 2, which differ from the capacitive sensor elements shown in FIGS. 6A and 6B with regard to the suspension of the movable electrodes, and so the following description is directed in particular to these differences. FIGS. 9C and 9D show schematic plan views of the substrates 100 of the capacitive sensor elements shown in FIGS. 7A and 7B, wherein the course of the trenches in the region of the clamped end of the movable electrodes 10 and 14 is different than the course of the trenches in the examples shown in FIGS. 6A and 6B. To put it more precisely, the trenches 104 in the examples shown in FIGS. 7A and 7B do not isolate the movable electrodes 10 and 14 from the substrate 100, with the result that the movable electrodes 10 and 14 are suspended from the substrate 100 at a first end 120. For the rest, the construction corresponds to that of the examples described with reference to FIGS. 6A and 6B, and so a detailed description can be omitted.

Figure 8A:
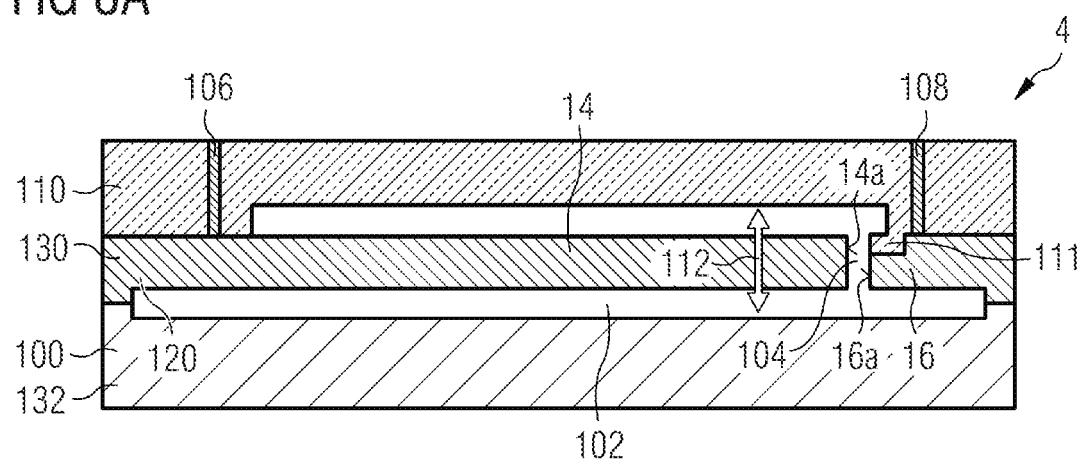
FIGS. 8A and 8B show schematic sectional views of examples of first and second capacitive sensor elements having PN isolation.
Figure 8B:
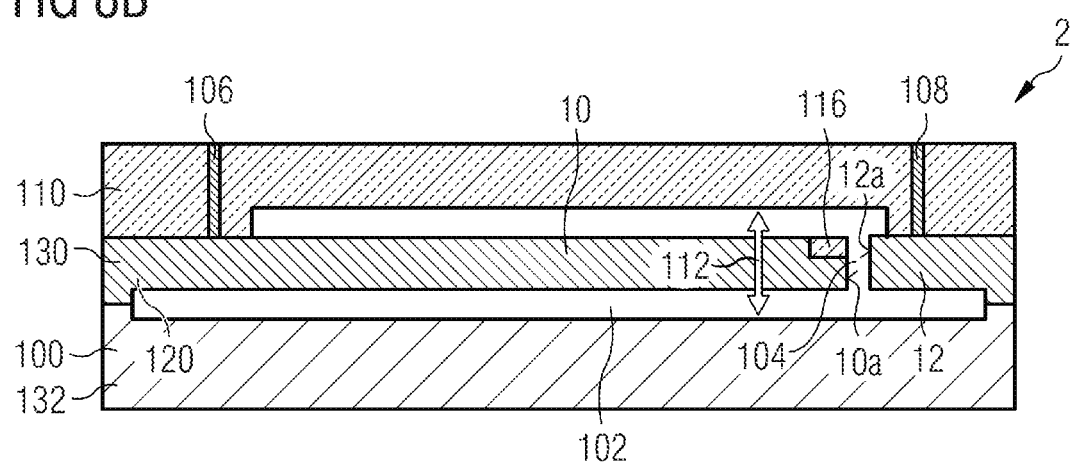
Figure 9E:
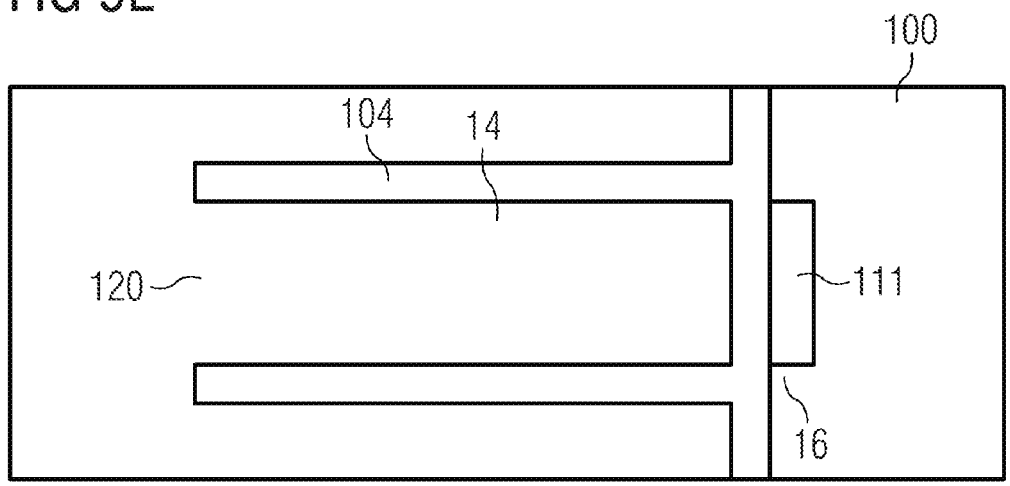
FIGS. 9E and 9F show schematic plan views of examples of substrates of a first and a second capacitive sensor element in accordance with FIGS. 8A and 8B.
Figure 9F:
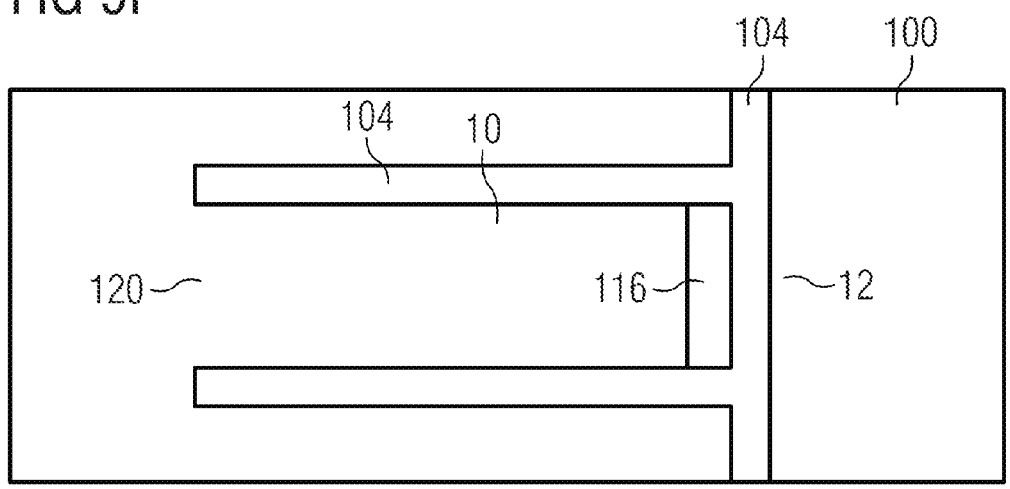

FIGS. 8A and 8B show schematic sectional views of examples of a second capacitive sensor element 4 and of a first capacitive sensor element 2. FIGS. 9E and 9F show schematic plan views of the substrate of the examples shown in FIGS. 8A and 8B. The examples shown in FIGS. 8A and 8B differ from the examples shown in FIGS. 7A and 7B in the type of isolation of the movable electrodes 10 and 14 from the stationary electrodes 12 and 16. The substrate 100 comprises two layers 130 and 132 having a different doping type. By way of example, the layer 130 can have an n-type doping, and the layer 132 can have a p-type doping. As is shown, the buried cavity 102 can be formed in both layers 130 and 132. The electrodes are structured in the upper semiconductor layer 130. The movable electrodes 10 and 14 are once again suspended from the substrate at a first end 120, while a second end at a distance therefrom is once again movable, as is indicated by an arrow 112. In the example shown in FIGS. 8A and 8B, the stationary electrodes 12 and 16 are isolated not only by the trenches 104 but moreover by the pn junction between the semiconductor layers 130 and 132 having different doping types. In this respect, in the examples shown in FIGS. 8A and 8B, the stationary electrode need not be completely surrounded by a buried cavity and trenches, but rather can be mounted at a part of the semiconductor layer 130.

Figure 10:
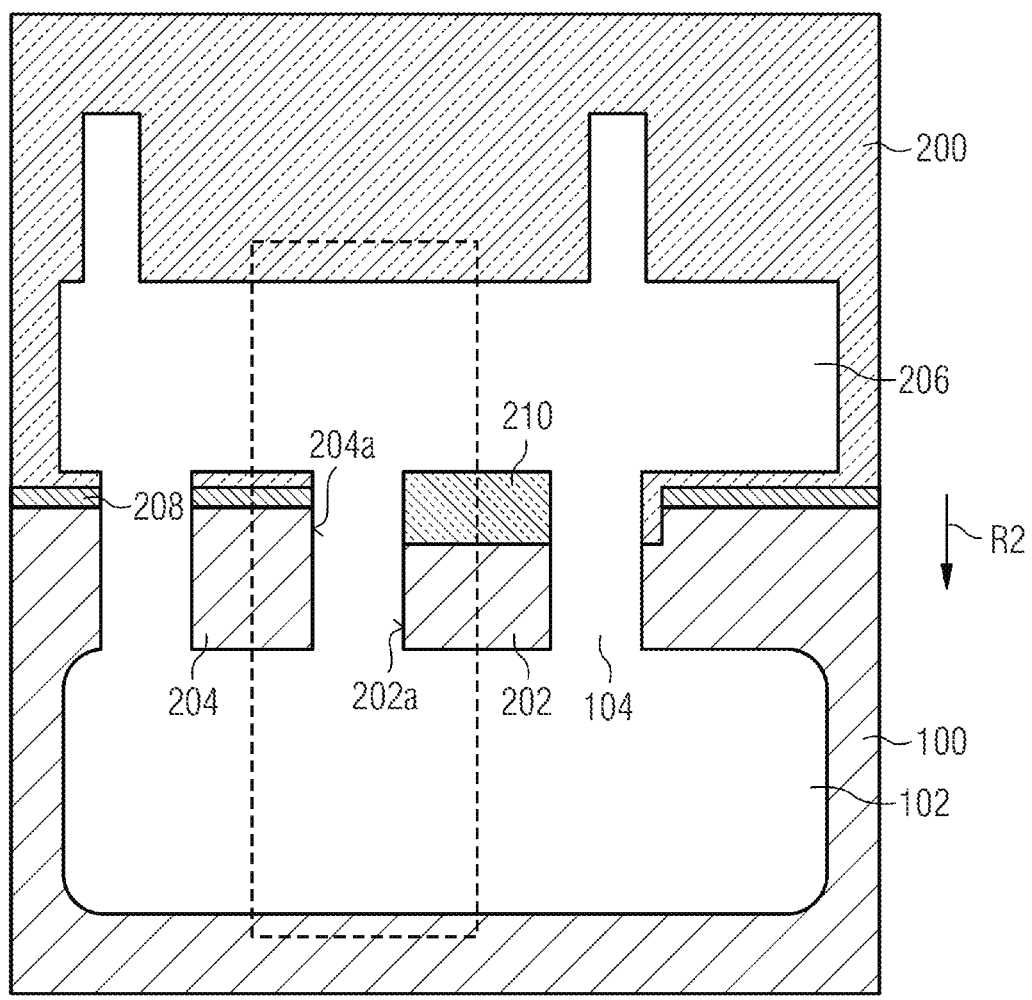
FIG. 10 shows a schematic sectional view of one example of a capacitive sensor element having an electrode modified by an insulator.
Figure 11:
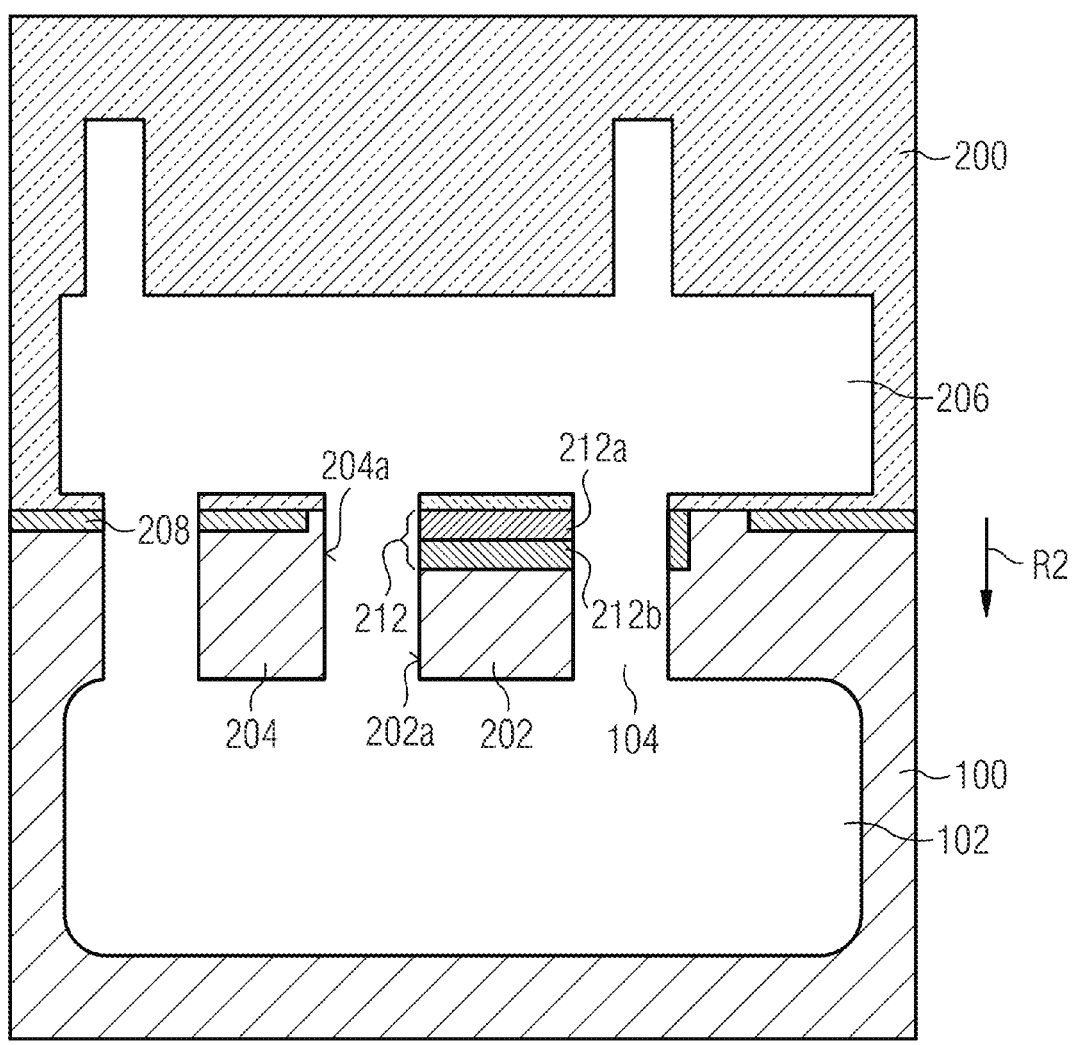
FIG. 11 shows a schematic sectional view of one example of a capacitive sensor element having an electrode modified by a counterdoping.

Referring to FIGS. 10 to 12, three examples of how a corresponding modification of the respective electrode which has the smaller dimension in the direction of movement can be achieved are described below. Referring to FIGS. 13 to 17, examples of methods for producing corresponding modifications are then described. It should be pointed out at this juncture that the corresponding figures are purely schematic, wherein in each case one of the electrodes can be designed as a movable electrode and one of the electrodes as a stationary electrode. By way of example, these electrodes can therefore be implemented in the manner as described above with reference to FIGS. 6 to 9.

In examples of the present disclosure, the first and second electrodes can be delimited on one side in each case by a cavity in a substrate. In examples, said cavity can be produced by means of a so-called Venezia method, as described below with reference to FIGS. 13A to 13C. Alternatively, however, the cavity can also be produced in other ways, for example by means of a buried sacrificial layer.

In examples of the present disclosure, the smaller extent of the respective electrode in the direction of movement can be implemented by an insulating material that replaces a part of the respective electrode, by a cutout in the respective electrode, or by an oppositely doped semiconductor material in the respective electrode.

FIG. 10 shows one example of a capacitive sensor element in which the smaller extent is implemented by an insulating material that replaces a part of the electrode. This electrode is also referred to hereinafter as a modified electrode, wherein this can be the movable electrode or the stationary electrode, depending on whether the first or the second capacitive sensor element of a micromechanical sensor is affected.

FIG. 10 shows a schematic sectional view of a capacitive sensor element comprising a substrate 100 and a cover 200. The cover 200 can be formed for example by a dielectric layer, for example an oxide layer. The cover 200 can completely enclose the top side of the substrate, for example in the case of an acceleration sensor. In examples, the cover 200 can have an opening, for example in the case of a differential pressure sensor.

The substrate 100 has a buried cavity 102 and trenches 104, which define a movable electrode and a stationary electrode, for example as was described above with reference to FIGS. 6 to 9. One of the electrodes constitutes a modified electrode 202, while the other electrode constitutes a non-modified electrode 204. Either the modified electrode 202 or the non-modified electrode 204 can be implemented as a movable electrode, while the other electrode is implemented as a stationary electrode. A cavity 206 can be provided in the cover 200, said cavity enabling a movement of the movable electrode vertically with respect to the substrate plane in both directions. The substrate 100 can comprise a highly doped contact layer 208. The modified electrode 202 and the non-modified electrode 204 can be formed by a doped semiconductor material, wherein a part of the semiconductor material of the modified electrode 202 is replaced by an insulator 210. Consequently, an extent of a sidewall surface 202a of the modified electrode 202 situated opposite a sidewall surface 204a of the non-modified electrode 204 in the direction of movement R2 is smaller than an extent of the sidewall surface 204a of the non-modified electrode 204. The insulator 210 can be implemented by a dielectric, for example. The dielectric can comprise oxide or dioxide.

In the example shown in FIG. 10, an asymmetry is thus introduced by a dielectric layer 210 being introduced into one of the electrodes on the top side, said dielectric layer replacing the electrically conductive material of the electrode. As has been explained, this modification can concern either the stationary electrode or the movable electrode. As has been described with reference to FIGS. 2 and 3, a difference signal that is different than 0 can be obtained as a result of the introduction of such an asymmetry.

FIG. 11 shows one example of a capacitive element which differs from the example shown in FIG. 10 with regard to the type of modification of the modified electrode 202. In the example shown in FIG. 11, the modified electrode 202 has a counterdoping region 212 in order to bring about corresponding asymmetrical characteristics. The counterdoping region has a doping type that is different than the doping type of the substrate 100. By way of example, said doping type can be a p-type doping if the substrate is n-doped. The counterdoping region can be produced for example by means of an implantation into the surface of the substrate in the region which defines the modified electrode. The counterdoping region can be connected to a different electrical node than the rest of the modified electrode, such that it does not contribute to the active capacitor area of the electrode. For this purpose, the counterdoping region can have a contact region 212a that is more highly doped than a remaining region 212b of the counterdoping region. In examples, it is possible for the counterdoping region 212 not to have a separate connection, with the result that it is left floating and is isolated from the remaining region of the modified electrode 202 via a p junction.

FIG. 12 shows a further example of a capacitive sensor element in which the smaller extent of the modified electrode 202 in the direction of movement is implemented by means of a cutout in the modified electrode 202. The cutout can be provided over the whole area on the electrode, as is indicated by a dashed line 214 in FIG. 12. Alternatively, the cutout can concern only a region of the modified electrode 202 that faces the non-modified electrode 204. By way of example, the cutout can extend from the side facing the non-modified electrode 204 only as far as a central region of the modified electrode 202, as indicated by a dashed line 216 in FIG. 12. The cutout can be produced for example by etching back the substrate.

Figure 13A:
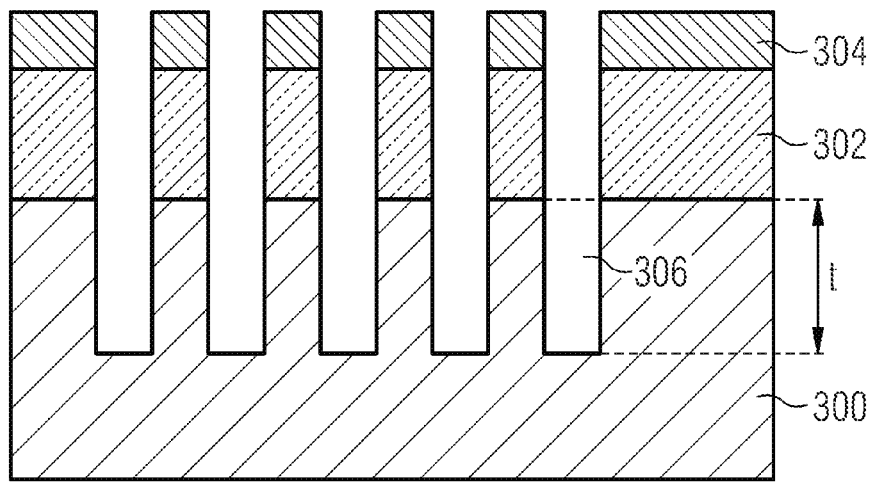
FIGS. 13A to 13C show schematic cross-sectional views for elucidating one example of a method for forming a cavity in a substrate.

In examples of the present disclosure, the cavity 102 in the substrate 100 can be produced by means of a so-called Venezia method. Said method can comprise etching trenches in a surface of the semiconductor substrate and annealing the semiconductor substrate in an H atmosphere in order to cause the semiconductor material to flow back, in order to unite the trenches below the surface and to produce a buried cavity in the semiconductor substrate. One example of such a method is explained with reference to FIGS. 13A to 13C. In one example of a corresponding method, a hard mask stack comprising an oxide layer 302 and a polysilicon layer 304 is deposited on a silicon substrate 300. The hard mask stack is structured and the structured hard mask stack is used to produce trenches down to a depth t in the substrate 300. The depth t can be 3 μm, for example. The resulting structure is shown in FIG. 13A.

Figure 13B:
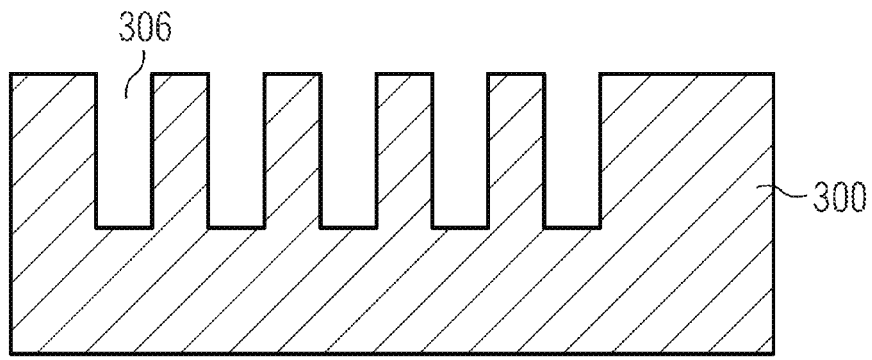
Figure 13C:
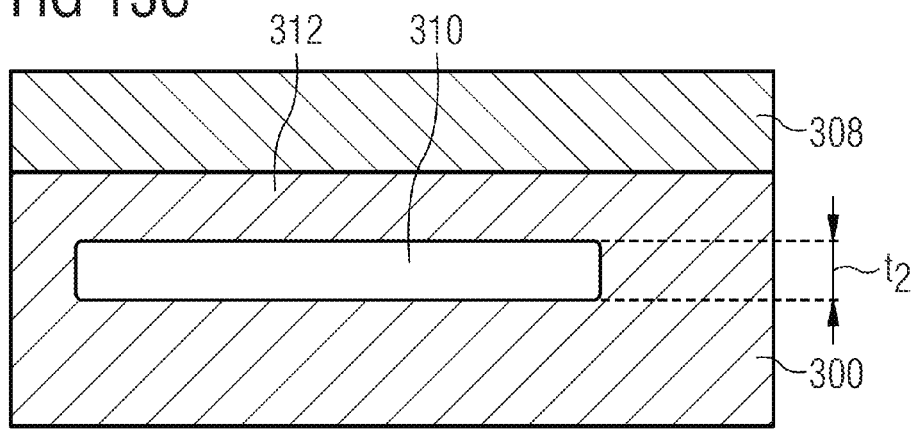

The hard mask stack is subsequently removed, as is illustrated in FIG. 13B. H2 annealing for silicon reflow is subsequently carried out. As a result of the H2 annealing, the trenches 306 combine to form a buried cavity 310 having a depth $t_2$. By way of example, the depth $t_2$ can be 1 μm. Optionally, as is shown in FIG. 13C, an epitaxial silicon layer 308 of suitable thickness and doping can be applied after the reflow. After the H2 annealing, chemical mechanical polishing (CMP) can take place in order to eliminate topology on the surface of the substrate on account of the cavity formation. By means of this method a cavity 310 can be produced in the semiconductor substrate 300, said cavity being closed by a doped semiconductor layer 312. In examples, the electrodes of the capacitive sensor element or of the capacitive sensor elements can be produced in the semiconductor layer 312, wherein the electrode wall surface of one of the two electrodes of the capacitive sensor element can be modified in order to have a smaller extent in the second direction than the opposite electrode wall surface of the other of the two electrodes. In examples, modifying can comprise replacing a part of the semiconductor layer that faces away from the cavity by an insulating material, producing a cutout in a part of the semiconductor layer that faces away from the cavity, or producing a counterdoping in a part of the semiconductor layer that faces away from the cavity. In other examples, a modification could also take place in order to increase the extent of one of the two electrodes in the direction of movement.

As was explained above, it is possible to implement a silicon epitaxial layer after the silicon reflow with the surface already closed. This can serve for increasing the mass of the movable part and thus for a greater deflection under acceleration in the case of an acceleration sensor. In examples, the reflow process can leave an approximately 1 μm thick silicon layer above the cavity, the thickness of which layer can be increased to 2 to 5 μm in examples by means of the epitaxy method.

In examples, as was explained above with reference to FIGS. 6 to 9, a contacting of the electrodes can be effected through an insulating layer 110. One example of how such a contacting can be effected is described with reference to FIG. 14. FIG. 14 shows purely schematically for explanatory purposes a substrate 400 having a buried cavity 402 and trenches 404, which define two electrodes 406 and 408. Although not illustrated in FIG. 14, the electrodes 406 and 408 can be for example corresponding electrodes of a capacitive sensor element, one of which electrodes is modified and one is not. An insulating layer 410 is arranged on the substrate 400, wherein a highly doped contact layer 412 can be arranged between the substrate 400 and the insulating layer 410. In order to produce contacts to the electrodes 406 and 408, trenches can be produced in the insulating layer 410, said trenches extending as far as the highly doped layer 412. A liner layer 414 can be deposited in the trenches, which liner layer can consist of Ti/TiN. By way of example, the liner layer 414 can be applied by sputtering. A heat treatment of said layer 414 can subsequently be effected in order to form Ti silicide, which can have a lower contact resistance compared with a pure metal-semiconductor Schottky contact. Afterward, a conductive material 416 can be applied or deposited in order to fill the trenches. The conductive material can be a metal, such as e.g. tungsten. Afterward, a wiring can be produced on the insulating layer 410, as is indicated by metallization regions 418 in FIG. 14, in order to produce an electrical connection to the electrodes.

Examples of the present disclosure provide methods for producing a micromechanical sensor element in which the electrode wall surface of one of the two electrodes has a smaller extent in the second direction than the opposite electrode wall surface. Examples of the present disclosure provide a method for producing a micromechanical sensor element which has two capacitive sensor elements each having a first and second electrode, wherein, in the first capacitive sensor element, the electrode wall surface of the movable electrode is produced with an extent in the second direction which is smaller than an extent of the opposite electrode wall surface of the stationary electrode, and wherein the electrode wall surface of the stationary electrode of the second sensor element is produced with an extent in the second direction which is smaller than an extent of the opposite electrode wall surface of the movable electrode of the second sensor element in the second direction. In examples, producing the electrodes of the respective sensor element comprises producing a cavity in a semiconductor substrate, said cavity being closed by a doped semiconductor layer, wherein both electrodes of the respective sensor element are produced in the semiconductor layer, wherein the electrode wall surface of the electrode having the smaller extent in the second direction is modified in order to have the smaller extent in the second direction. In other examples, both electrodes of the respective sensor element can be produced in the semiconductor layer, wherein the electrode wall surface of the electrode which does not have the smaller extent in the second direction is modified in order to have a larger extent in the second direction than the opposite electrode wall surface of the other of the two electrodes.

Examples make it possible to produce corresponding micromechanical sensors and sensor elements using microsystems technology (MEMS technology).

One example of a method by which a capacitive sensor element having a non-modified electrode and a modified electrode, as is shown in FIG. 10, can be produced is described below with reference to FIGS. 15A to 15I.

Figure 15A:
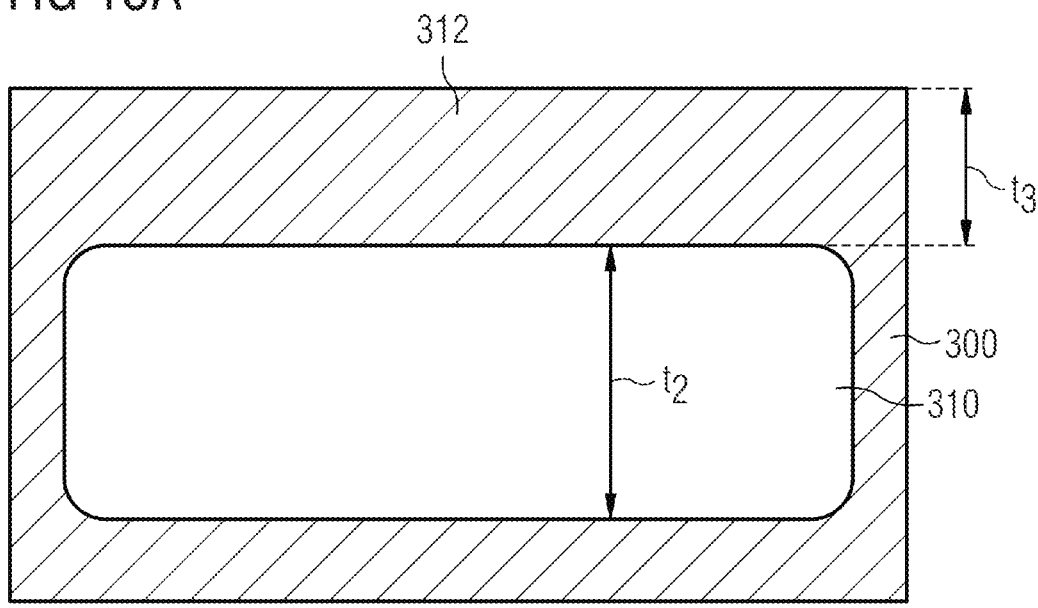

FIG. 15A shows a semiconductor substrate 300, in which a buried cavity 310 is produced. The semiconductor substrate 300 can consist of silicon, for example. The semiconductor substrate 300 can have a doping of more than $5\times10^{17}$. A semiconductor layer 312 is arranged above the cavity 310. The substrate shown in FIG. 15A can be produced for example by means of a Venezia method as described above with reference to FIGS. 13A to 13C. A depth $t_2$ of the cavity 310 can be 1 µm, for example. A thickness $t_3$ of the semiconductor layer 312 can be 2 to 5 µm, for example. It should be noted at this juncture that the drawings are not true to scale in this regard. The thickness of the semiconductor layer 312 can be increased for example by depositing an epitaxial silicon layer having a corresponding doping.

Figure 15B:
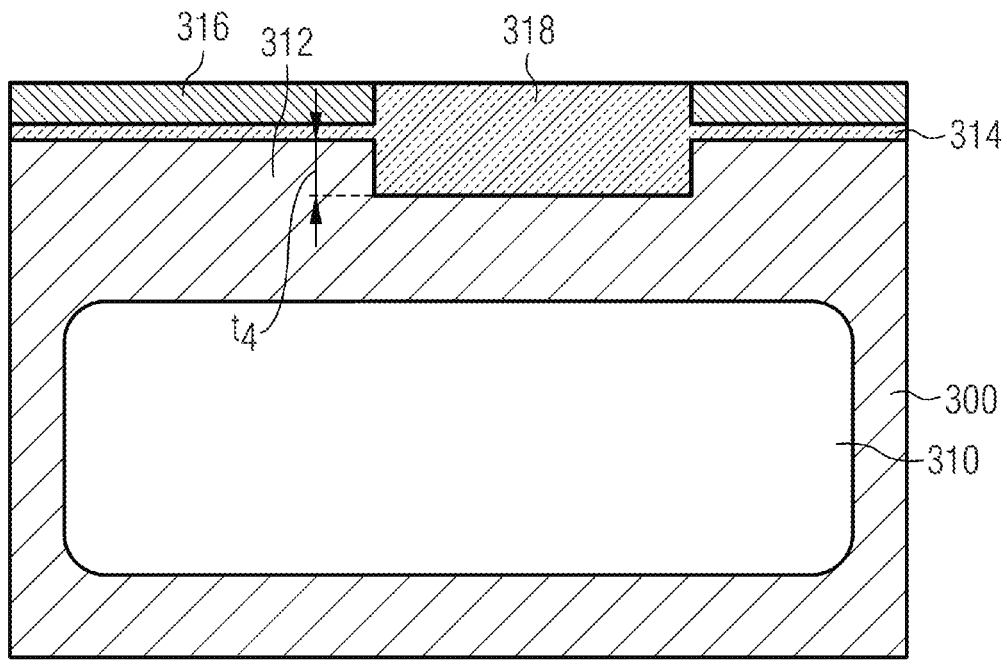

Proceeding from the structure shown in FIG. 15A, an oxide layer 314 is applied to the surface of the semiconductor substrate 300, and a hard mask 316, which can consist of silicon nitride, for example, is applied to said oxide layer. A shallow trench having a depth $t_4$, which can be 1 µm, for example, is subsequently produced. The shallow trench is then filled with an oxide 318. Afterward, a CMP (chemical mechanical polishing) method can be carried out, which ends on the nitride hard mask 316. The resulting structure is shown in FIG. 15B. Oxide etching-back is subsequently carried out, which is known as "deglaze", whereupon the nitride hard mask 318 is removed. A nitride etch stop layer 320 is subsequently deposited. The latter can consist of SiO, for example. The resulting structure is shown in FIG. 15C.

Figure 15C:
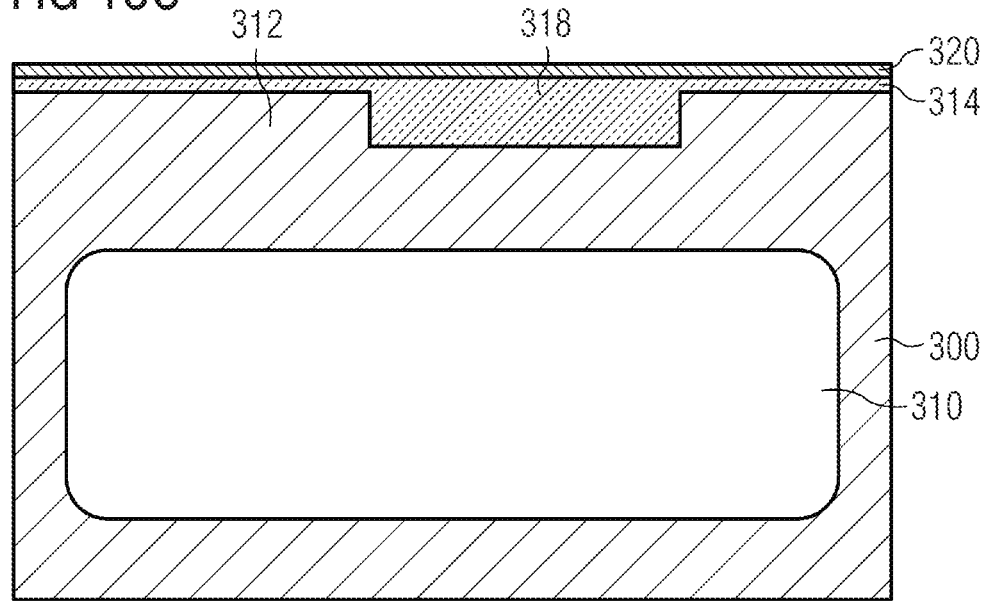
Figure 15D:
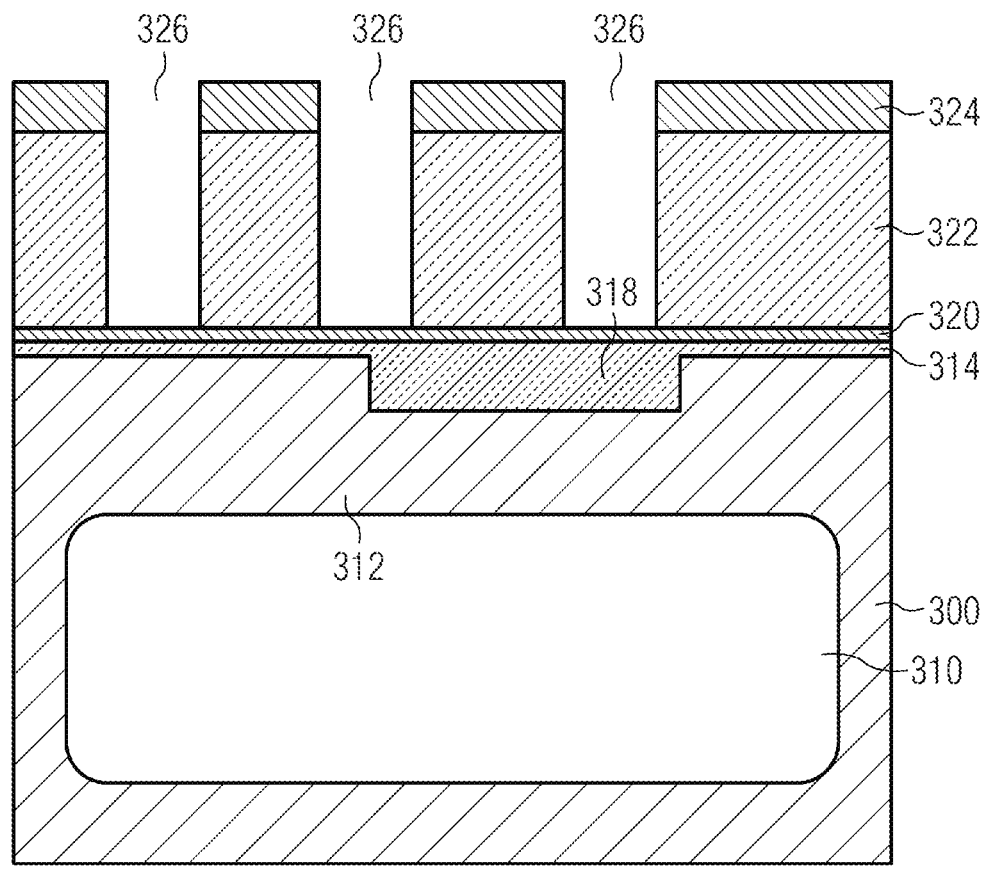

Proceeding from the structure shown in FIG. 15C, a further hard mask, which can be referred to as a trench hard mask, is applied to the nitride etch stop layer 320. The trench hard mask can comprise an oxide layer 322 and a polysilicon layer 324. The oxide layer 322 can have a thickness of approximately 2 µm, for example, and the polysilicon layer 324 can have a thickness of approximately 500 nm, for example. Openings 326 corresponding to the trenches to be produced in the semiconductor layer 312 are then formed in the trench hard mask. The resulting structure is shown in FIG. 15D. This is followed by nitride etching and oxide etching through the openings 326 as far as the surface of the semiconductor substrate 300. The resulting structure is shown in FIG. 15E. This is followed by silicon etching through the openings 326, as a result of which etching trenches 104 are produced in the semiconductor layer 312, said trenches defining the electrodes of the capacitive sensor element. The resulting structure is shown in FIG. 15F.

Figure 15G:
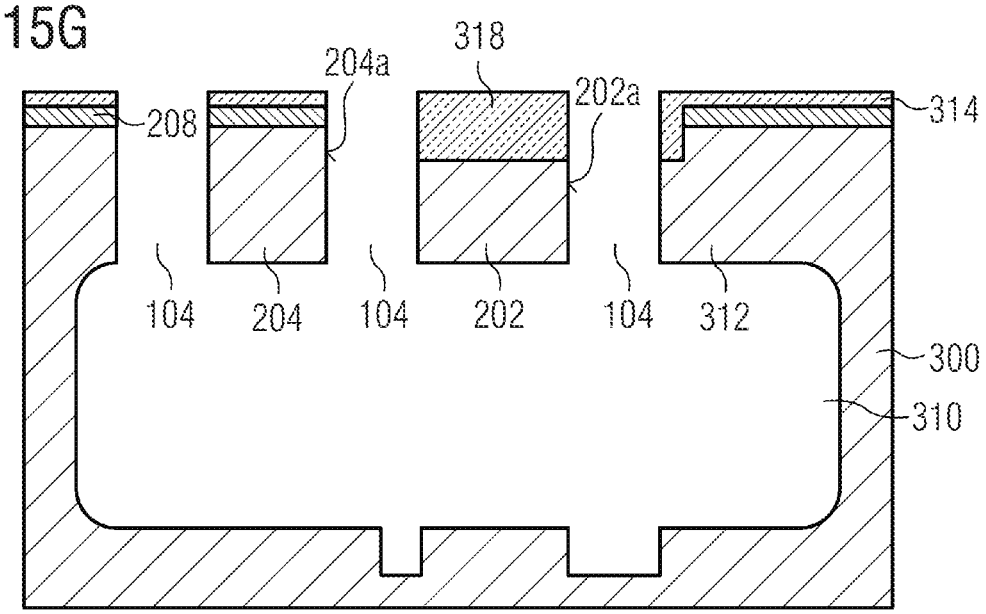

Proceeding from the structure shown in FIG. 15F, the hard mask comprising the layers 320, 322 and 324 is removed. This is followed by a contact implantation with a high dose in order to produce the contact layer 208. By way of example, for producing the contact implantation it is possible to use a phosphorus doping for an n-type silicon substrate. An activation annealing is subsequently carried out, which results in the structure shown in FIG. 15G, in which the contact implantation is formed on the surface of the semiconductor substrate 300. As can be seen in FIG. 15G, the modified electrode 202 having the electrode wall surface 202a and the non-modified electrode 204 having the electrode wall surface 204a are formed as a result.

Figure 15H:
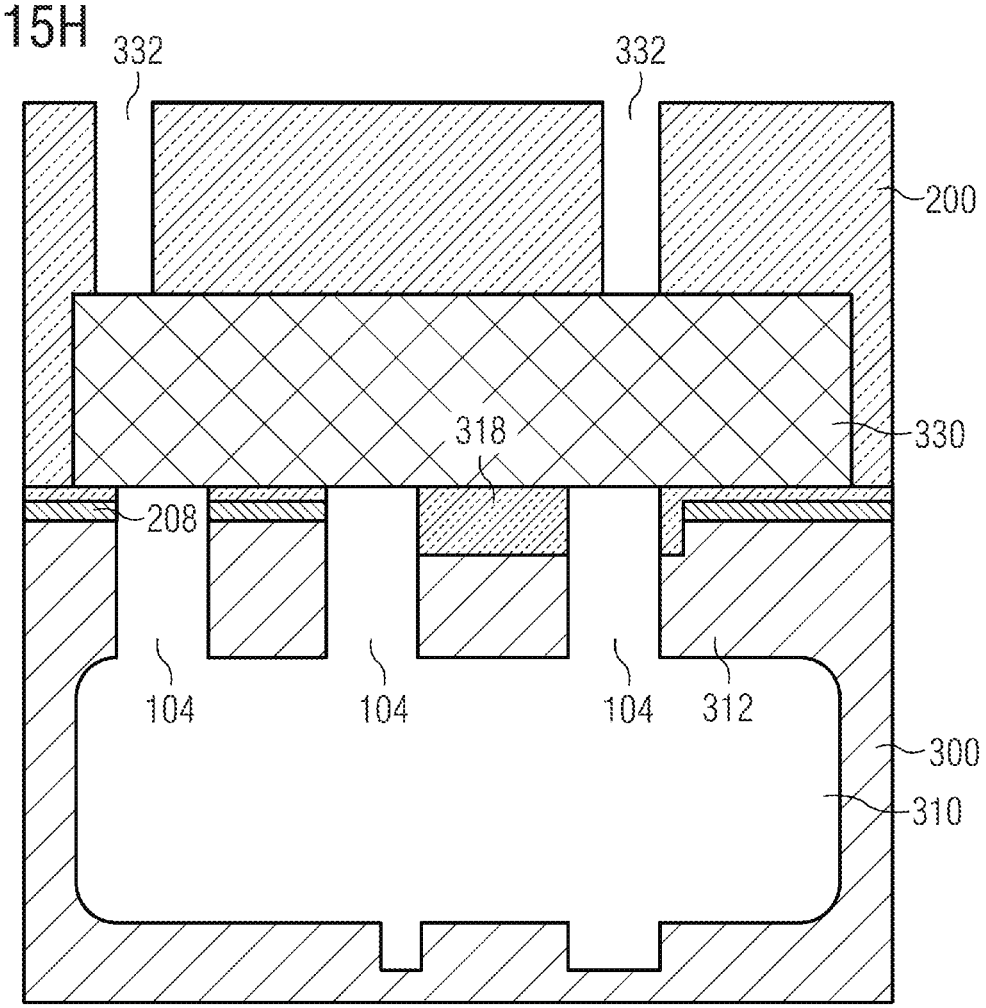
Figure 15I:
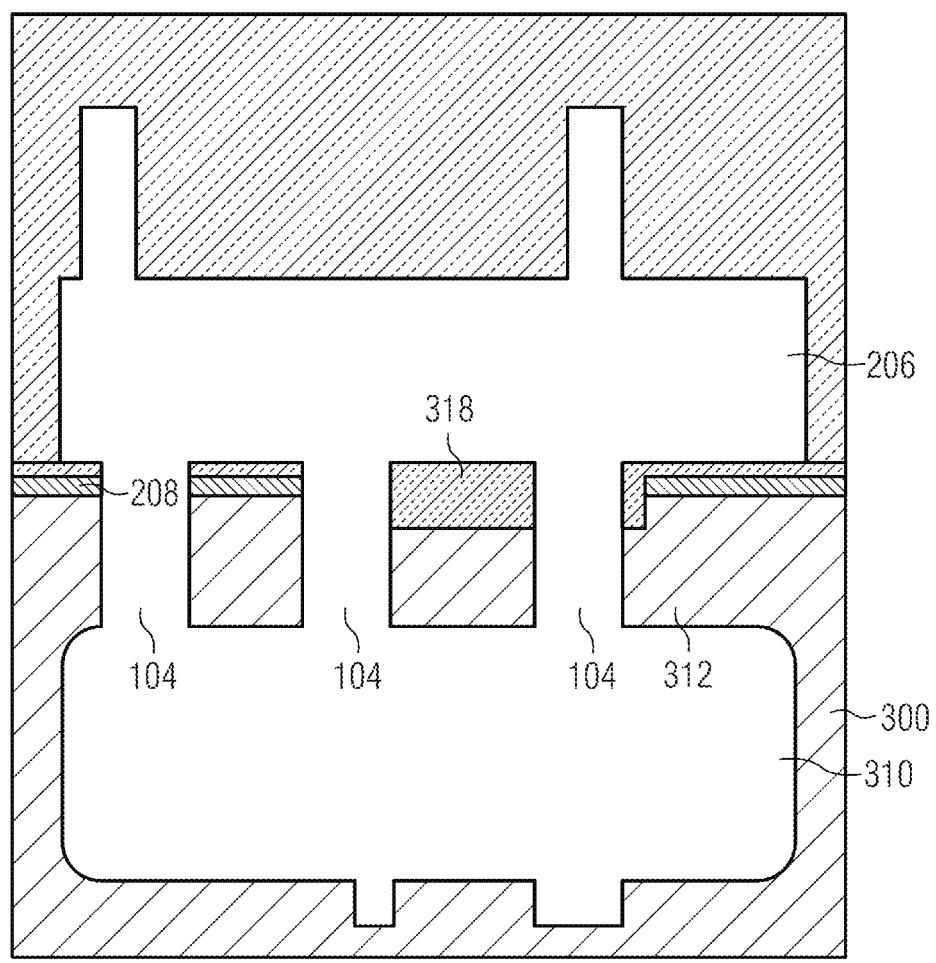

One example of a method for producing a covering for the structure shown in FIG. 15G will now be described with reference to FIGS. 15H and 15I. For this purpose, firstly carbon is deposited onto the top side of the structure shown in FIG. 15G and is structured in order to produce the carbon layer 330 shown in FIG. 15H. Said carbon layer 330 constitutes a sacrificial layer. Afterward, an oxide layer 200 is deposited and structured in order to expose channels 332 serving for removing the carbon layer 330. Afterward, the carbon layer 330 is removed and an HDP oxide cavity sealing (HDP=high density plasma) is carried out in order to close the cavity 206 produced as a result of the removal of the carbon layer. This results in the structure shown in FIG. 15I, which corresponds to the capacitive sensor element described above with reference to FIG. 10.

One example of a method for producing a capacitive sensor element such as is shown in FIG. 11 is described below with reference to FIGS. 16A to 16I.

Figure 16A:
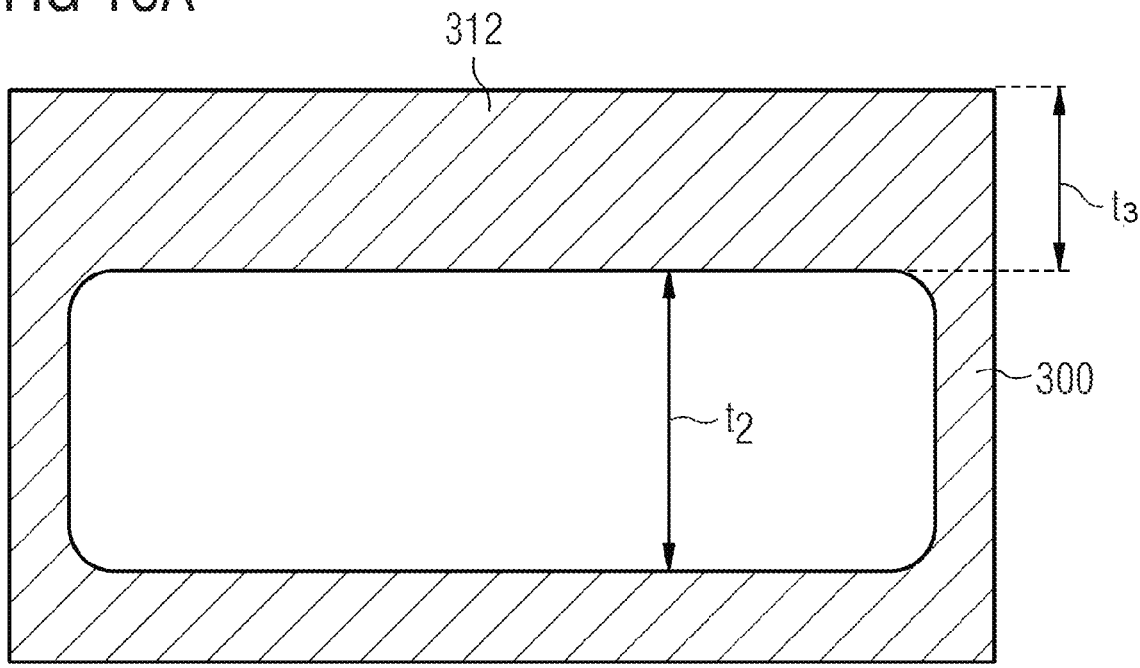
FIGS. 16A to 16I show schematic sectional views for elucidating one example of a method for producing a capacitive sensor element having an electrode modified by a counterimplantation.
Figure 16B:
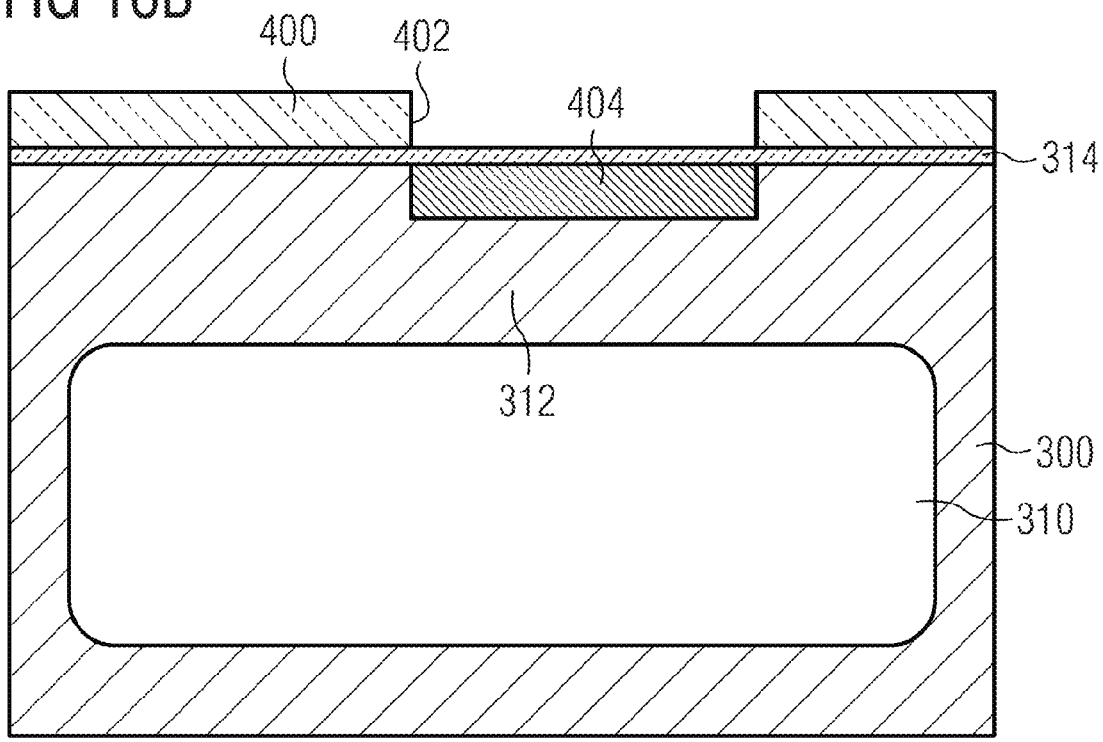

FIG. 16A once again shows the starting substrate 300 and corresponds to FIG. 15A in this regard. Proceeding from this structure, firstly an oxide layer 314 is applied. A covering resist is applied to said oxide layer 314 and is structured in order to produce therein a cutout 402 having the form of a counterimplantation 404 to be produced in the silicon layer 312. An implantation is subsequently carried out in order to produce the counterimplantation 404 in the silicon layer 312. The counterimplantation 404 can be produced for example down to a depth of 1 µm. The counterimplantation 404 has a doping type that is different than the doping type of the semiconductor substrate 300. The resulting structure is shown in FIG. 16B.

Figure 16C:
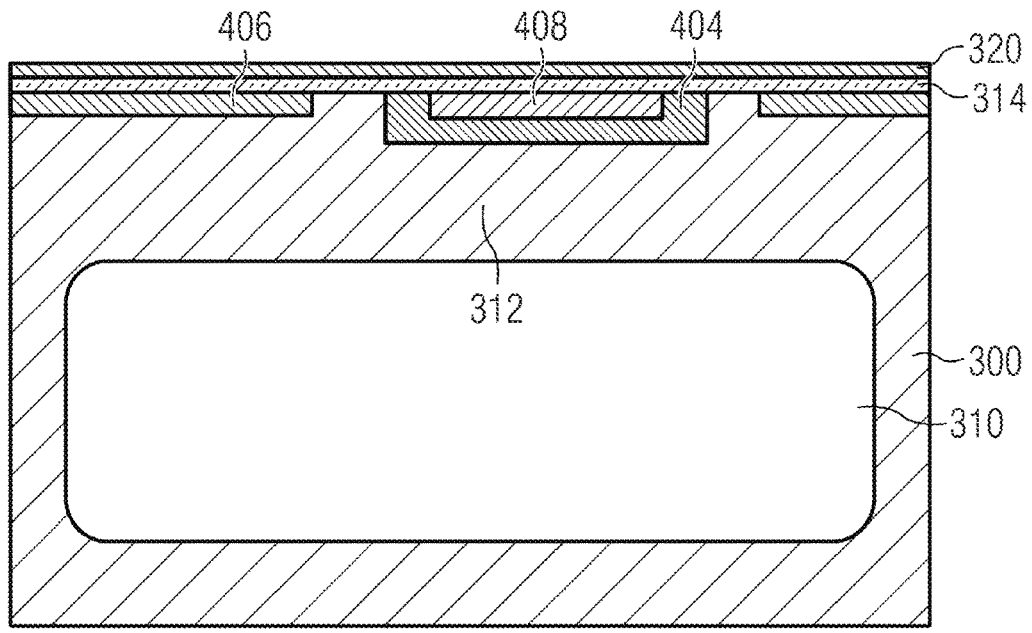

Afterward, the resist 400 is removed and a nitride etch stop layer 320 is deposited. Afterward, it is possible to carry out a masked high-dose contact implantation for the semiconductor substrate 300 in order to produce highly doped contact regions 406. Furthermore, it is optionally possible to carry out a masked high-dose contact implantation for the counterimplant 404 in order to produce a highly doped contact region 408 in the counterimplant 404. The highly doped contact region 408 is of the same doping type as the counterimplant 404. By way of example, the semiconductor substrate 300 can be n-doped and the counterimplant 404 can be p-doped. An annealing activation can subsequently be carried out. The resulting structure is shown in FIG. 16C.

Figure 16D:
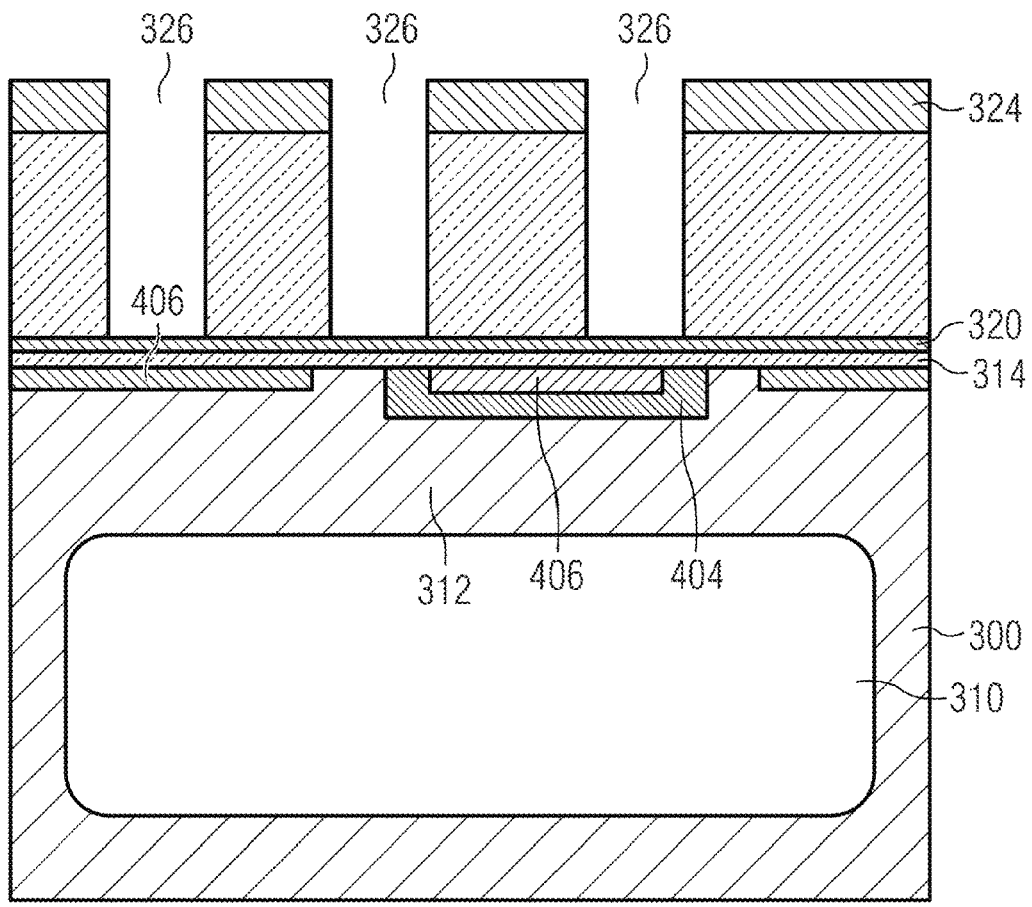
Figure 16E:
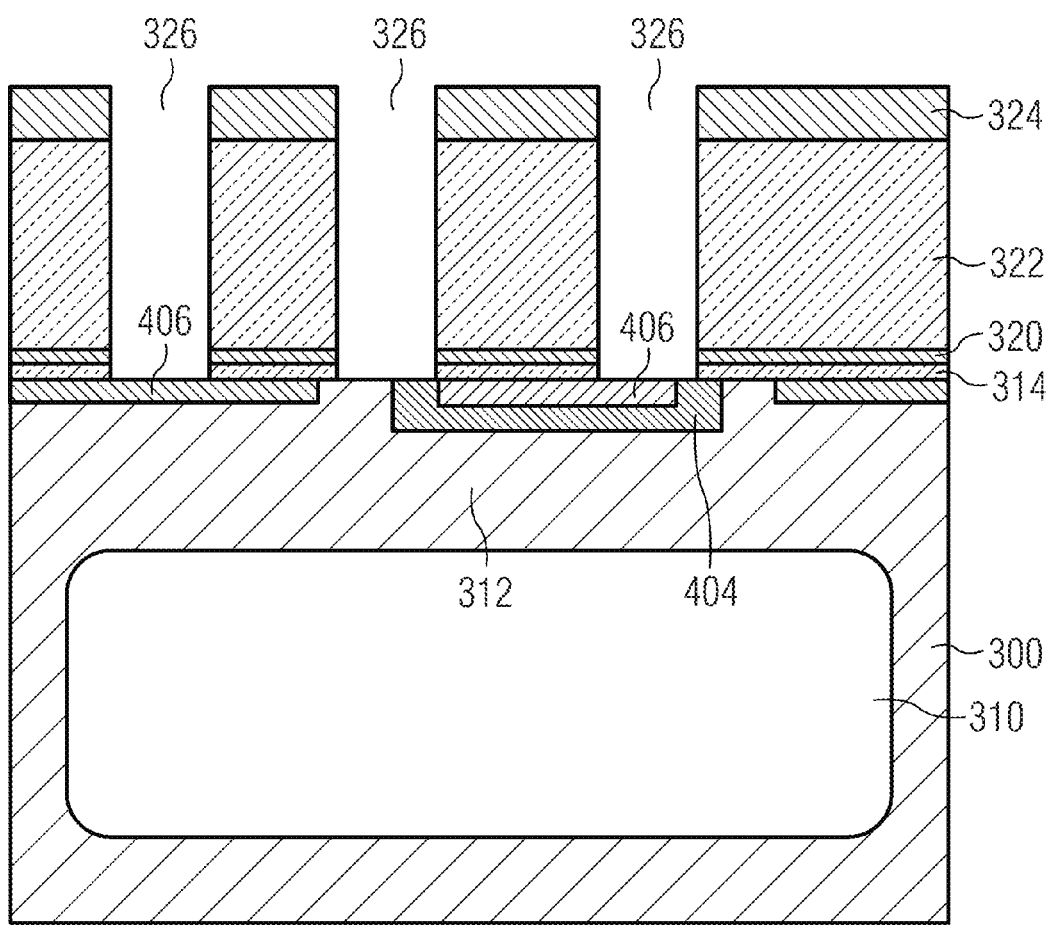

A trench hard mask is then produced, such as was described above with reference to FIG. 15D. The resulting structure is shown in FIG. 16D. Afterward, the nitride etch stop layer 320 is opened through the openings 326. Anisotropic oxide etching is then carried out selectively with respect to the semiconductor substrate 300. The resulting structure is shown in FIG. 16E.

Figure 16F:
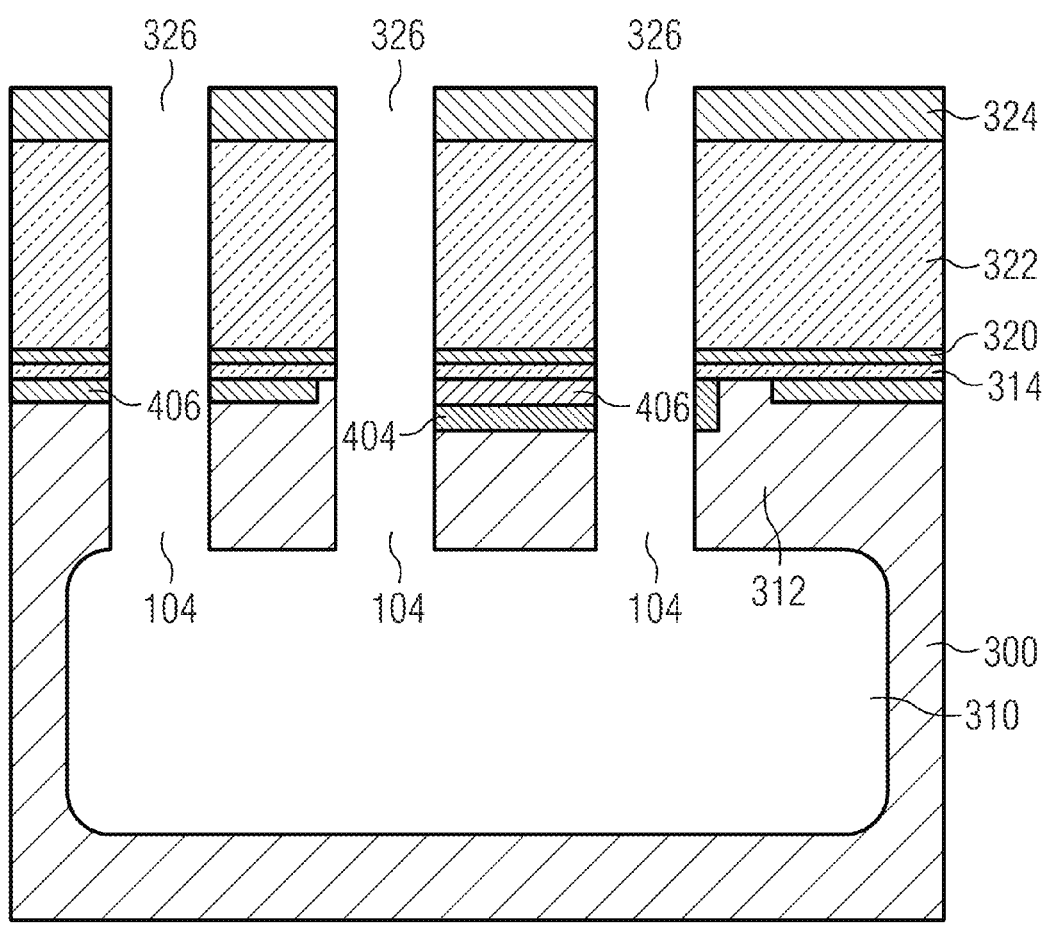
Figure 16G:
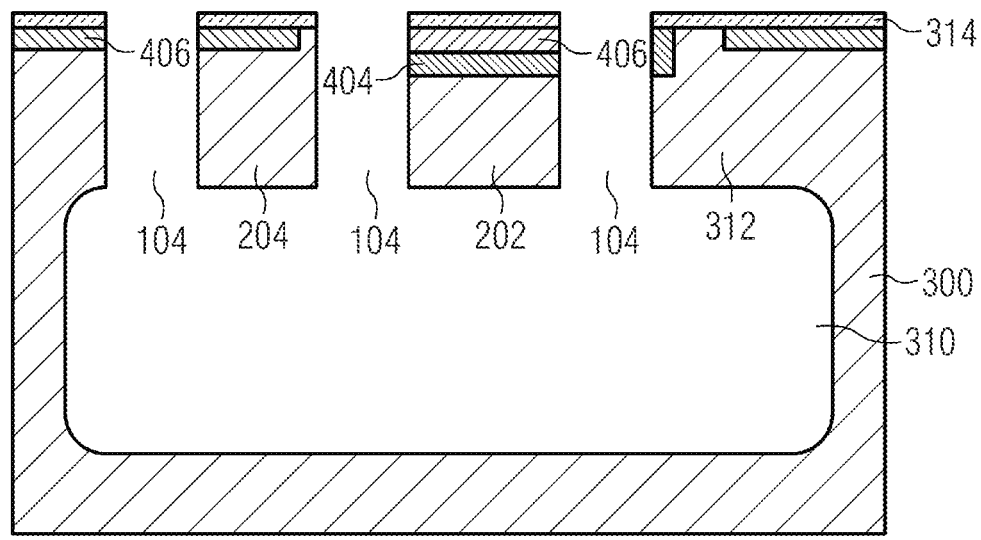
Figure 16H:
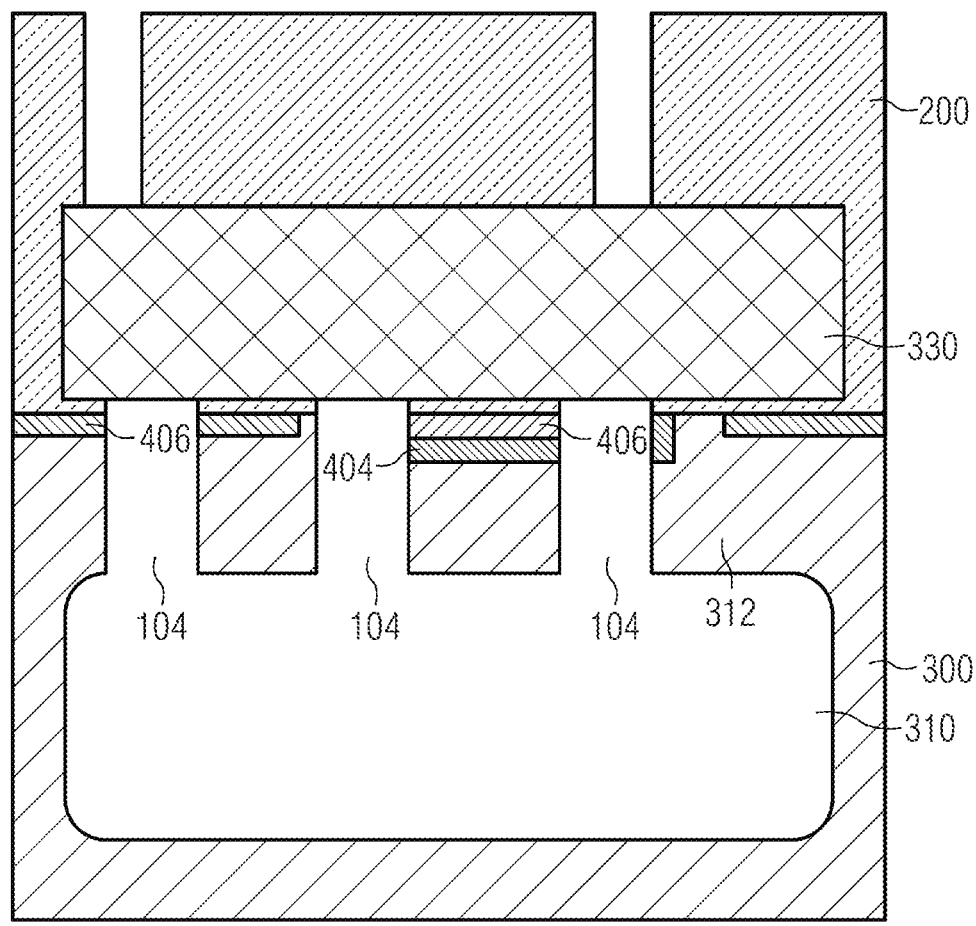
Figure 16I:
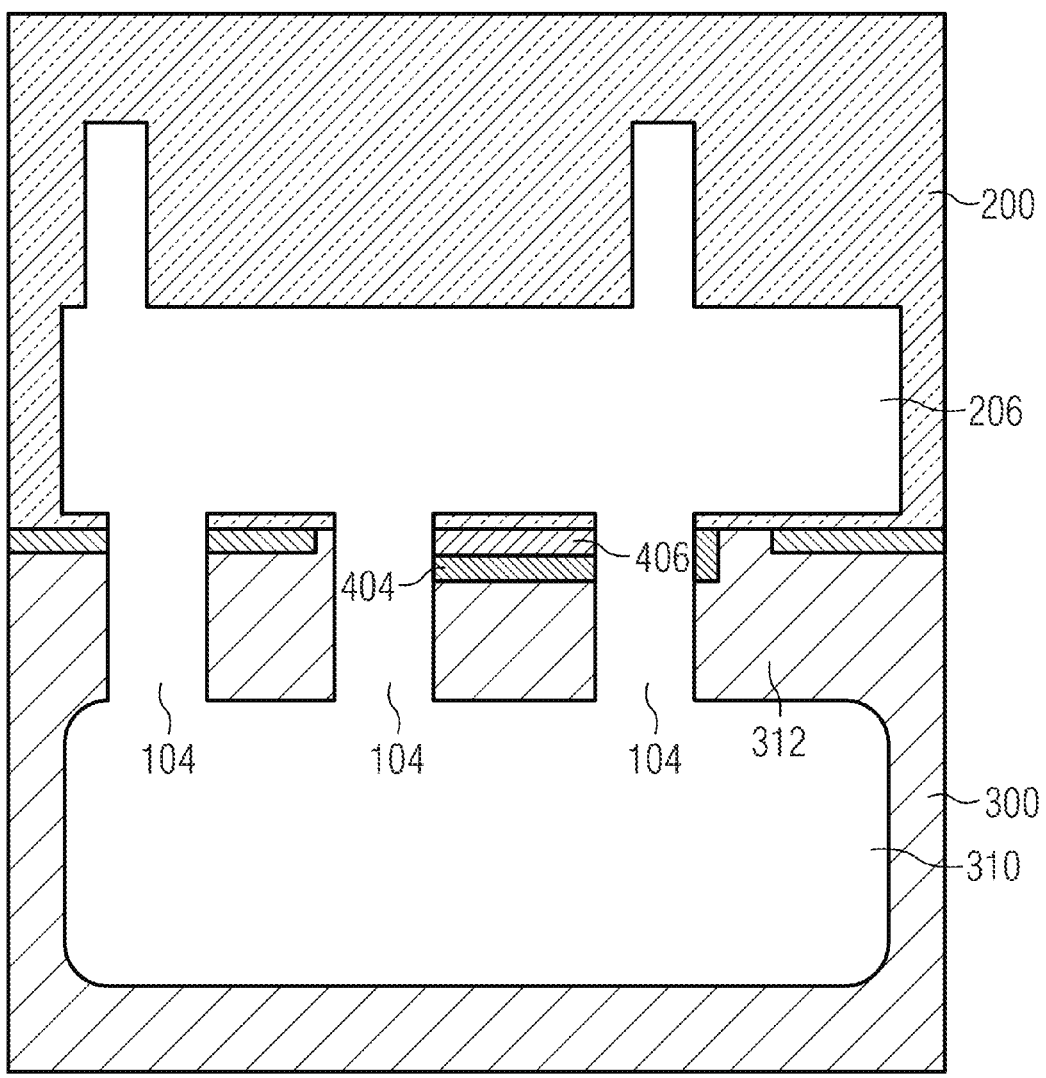

Processing is subsequently carried out, which processing substantially corresponds to the processing described above with reference to FIGS. 15F to 15I and thus need not be explained specifically in detail. As shown in FIG. 16F, trench etching is carried out through the openings 326 in order to produce the trenches 104 in the semiconductor layer 312. The hard mask is thereupon removed, as is shown in FIG. 16G, but a contact implantation is no longer carried out after the removal of the hard mask since the contact implantations have already been produced. As is shown in FIGS. 16H and 16I, an encapsulation or a cover is subsequently produced, as was described above with reference to FIGS. 15H and 15I. The resulting structure shown in FIG. 16I corresponds to a capacitive sensor element as shown in FIG. 11 and described above.

Figure 17A:
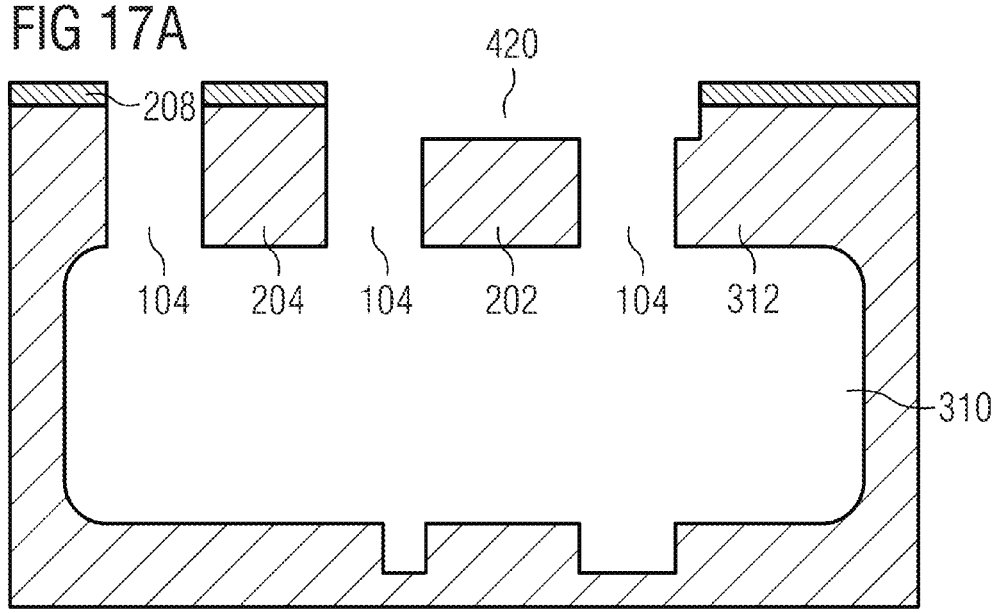
FIGS. 17A to 17C show schematic sectional views for elucidating one example of a method for producing a capacitive sensor element having an electrode modified by a cutout.
Figure 17B:
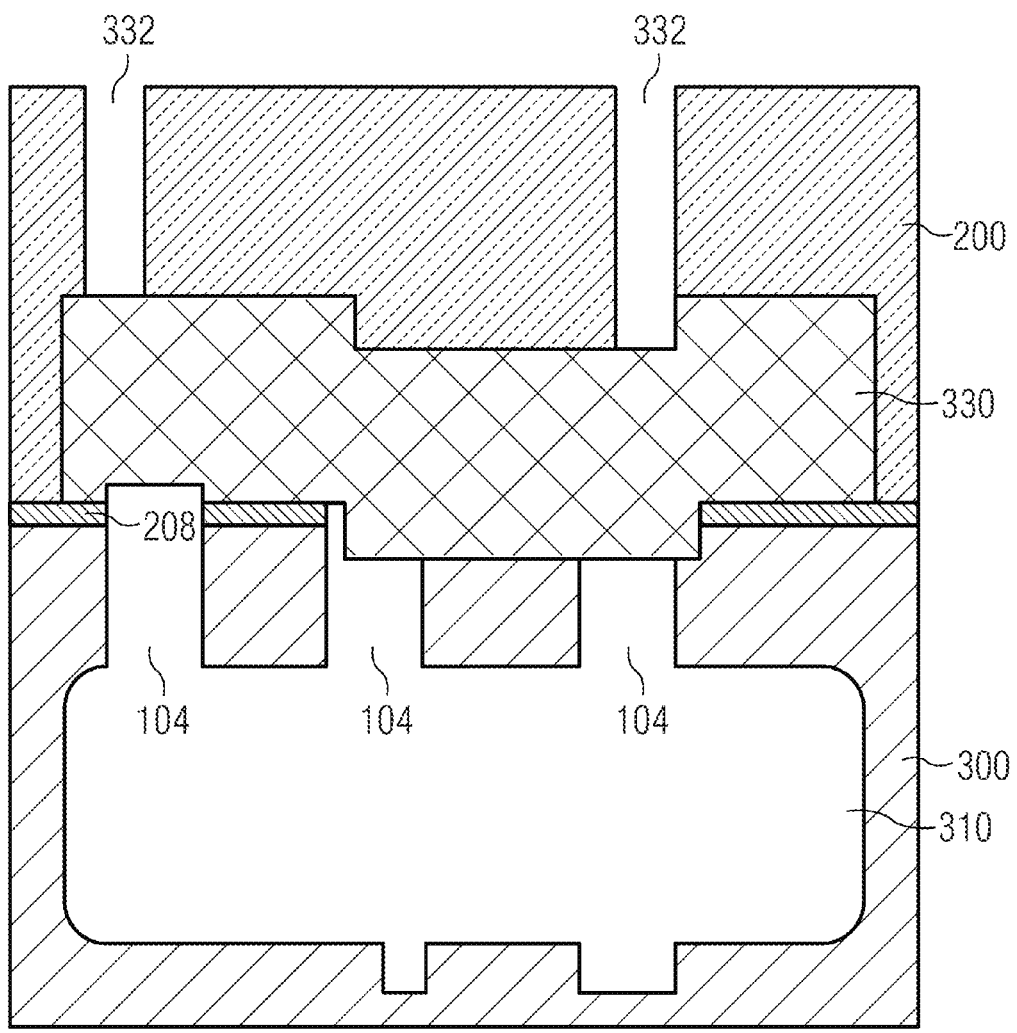
Figure 17C:
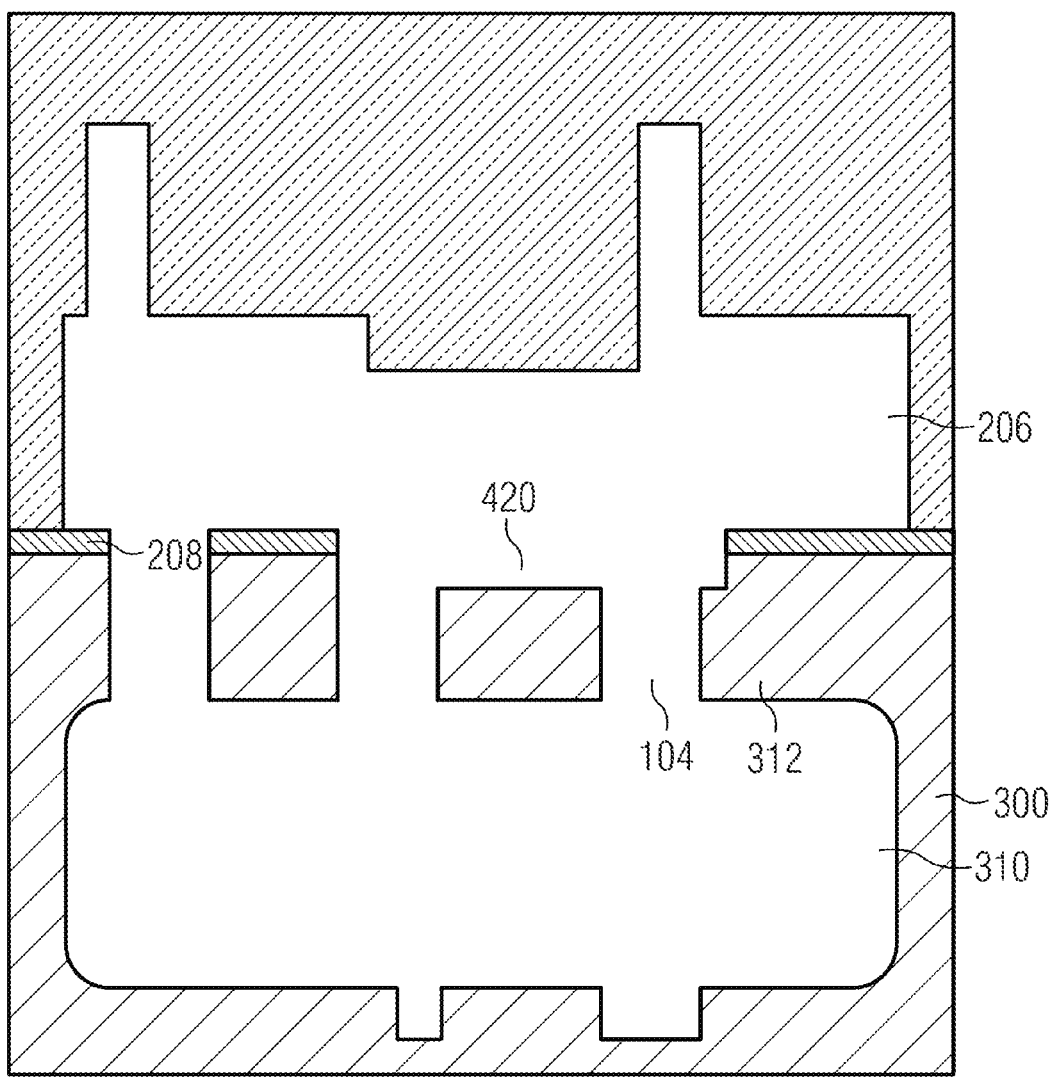

One example of a method for producing a capacitive sensor element such as was described above with reference to FIG. 12 is explained below with reference to FIGS. 17A to 17C. In this case, the initial processing corresponds to the processing described above with reference to FIGS. 15A to 15G, and so reference is made to these figures in this regard. Proceeding from the structure shown in FIG. 15G, the oxide 318 and the oxide layer 314 are then removed. The structure shown in FIG. 17A is thereby obtained, in which a part of the modified electrode 202 is replaced by a cutout 420. Proceeding from the structure shown in FIG. 17A, an encapsulation or a cover can once again be produced using a carbon layer 330, as was described above with reference to FIGS. 15H and 15I. This process is shown in FIGS. 17B and 17C, wherein, with regard to the description of this process, reference is made to the above explanations with regard to FIGS. 15H and 15I. The process described with reference to FIGS. 17A to 17C thus differs from the process described with reference to FIGS. 15A to 15I in particular in that the isolation region 318 formed on the modified electrode is removed in order to produce a cutout 420.

Only the steps relevant to the description of the present disclosure have been described in each case with reference to FIGS. 15 to 17, and the description of additional steps, such as the contacting of the respective electrodes, for example, has been omitted for the sake of clarity.

Examples of micromechanical sensors in accordance with the present disclosure have two capacitive sensor elements, wherein the movable electrode is correspondingly modified in a first of the sensor elements, and the stationary electrode is correspondingly modified in a second capacitive sensor element. FIG. 18A schematically shows a plan view of a second capacitive sensor element 4 comprising a stationary electrode 16 and a movable electrode 14, and FIG. 18B schematically shows a plan view of a first capacitive sensor element 2 comprising a movable electrode 10 and a stationary electrode 12. It should be noted at this juncture that the plan views in FIGS. 18A and 18B are once again purely schematic and do not contain any details regarding the mounting of the individual electrodes. The stationary electrode 16 is modified in the sensor element 4 and the movable electrode is modified in the sensor element 2, as is indicated in each case by a rectangle 400. Contacts 402 for the electrodes are furthermore schematically illustrated in FIGS. 18A and 18B. Furthermore, the isolating trench 104 surrounding the electrodes is schematically illustrated in FIGS. 18A and 18B. In these figures, the outer rectangle 404 can indicate the extent of the buried cavity formed in the substrate. A rectangle 406 schematically shows the cavity produced by the removal of the carbon layer during the production of the encapsulation. The dashed line 410 schematically indicates a sectional plane for the sectional views in FIGS. 10 to 12.

The sensor elements 2 and 4 form one example of a micromechanical sensor in accordance with the present disclosure and can be arranged on a common substrate or on separate substrates. In examples, the electrodes of the sensor elements can be formed in a common semiconductor layer arranged above a buried cavity, or in a semiconductor layer arranged above a plurality of cavities. Furthermore, the electrodes of the different sensor elements can be arranged in different semiconductor layers. In examples, the sensor elements can be monolithically integrated and can be subjected to joint processing. In other examples, discrete processing of the sensor elements can take place. In examples of the present disclosure, the first and second capacitive sensor elements can be formed in the same substrate. In examples, the first and second capacitive sensor elements can be formed in separate substrates, the substrate planes of which are parallel to one another.

Figure 19:
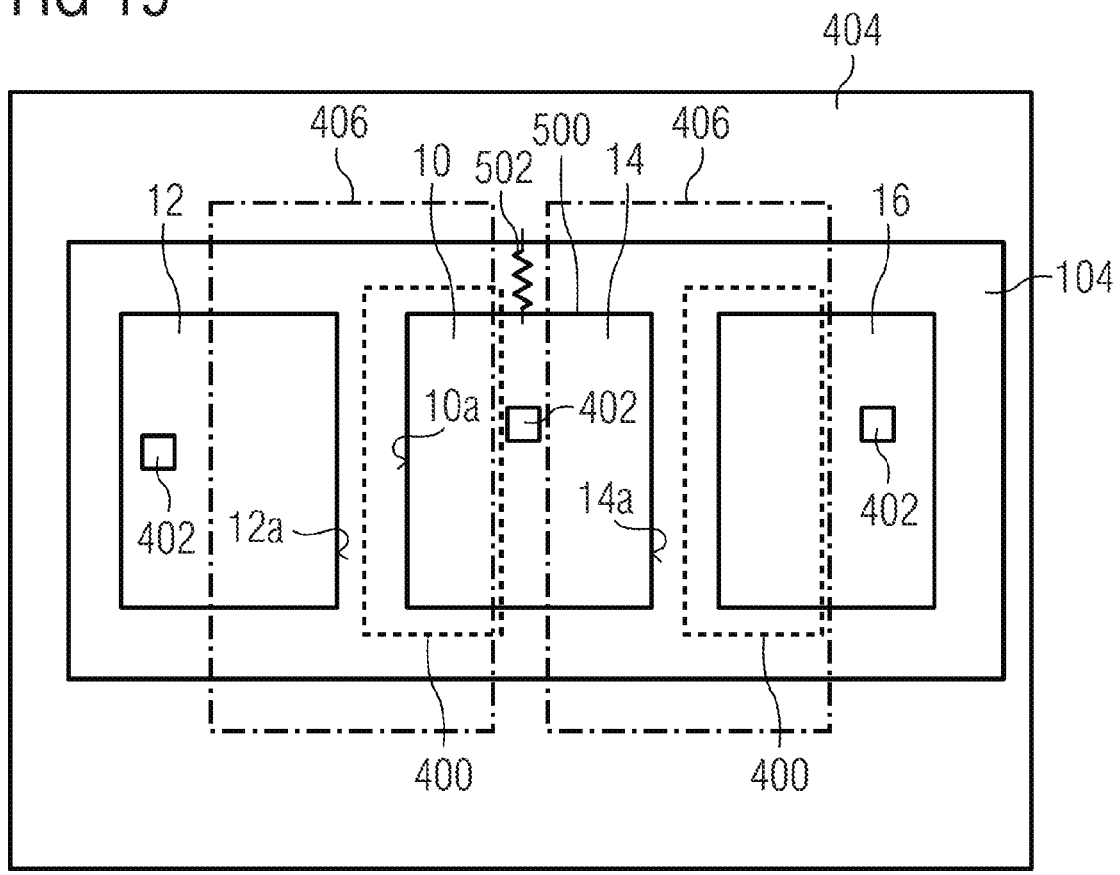
FIG. 19 shows a schematic plan view of one example of a micromechanical sensor in which a first and a second capacitive sensor element have a common movable element.

In examples of the present disclosure, the first electrodes of the first and second sensor element can be arranged on a common movable element. A schematic plan view of one corresponding example is shown in FIG. 19. Reference signs identical to those in FIGS. 1A and 1B and FIGS. 18A and 18B are used in FIG. 19. In accordance with the example shown in FIG. 19, the first movable electrode 10 and the second movable electrode 14 are arranged on a common movable element 500, which can be formed in a semiconductor layer arranged above a buried cavity 404. The element 500 is suspended movably, as is indicated by a spring 502, such that the movable element is movable vertically with respect to the substrate plane. Furthermore, the micromechanical sensor shown in FIG. 19 has a stationary electrode 12 and a stationary electrode 16. The stationary electrode 12 and the movable electrode 10 form a first capacitive sensor element and the movable electrode 14 and the stationary electrode 16 form a second capacitive sensor element. Corresponding electrode wall surfaces 12a and 10a of the electrodes 10 and 12 are situated opposite one another, and corresponding electrode wall surfaces 14a and 16a of the electrodes 14 and 16 are situated opposite one another, such that a capacitance is formed between them. As is indicated by rectangles 400 in FIG. 19, the movable electrode 10 and the stationary electrode 16 are modified in this example.

In examples of the capacitive sensor elements, the mutually opposite electrode wall surfaces are planar. In other examples, the mutually opposite electrode wall surfaces are non-planar. FIGS. 20A and 20B show an example in which mutually opposite electrode wall surfaces are non-planar, wherein FIG. 20A corresponds to FIG. 18A and FIG. 20B corresponds to an enlarged view of the region 520 in FIG. 20A in order to illustrate mutually opposite electrode wall surfaces 14b and 16b that are arranged interdigitally. It should be emphasized here that FIG. 20B likewise shows a plan view, such that the movable electrode 16 is movable into and out of the plane of the drawing, that is to say vertically with respect to the substrate plane. In other examples, the mutually opposite electrode wall surfaces can have other shapes.

In examples, the micromechanical sensor can be designed to detect an arbitrary physical variable that brings about a movement of the movable electrodes in the second direction. In examples, the micromechanical sensor can be designed as an acceleration sensor, wherein the first electrodes are movable in the second direction in response to an acceleration in the second direction. In such examples, the movable electrode can be formed by an oscillating mass or can be arranged on an oscillating mass that is deflected in response to an acceleration. In other examples, the micromechanical sensor can be designed as a pressure sensor, wherein the first electrodes are movable in response to a pressure acting on the first electrode.

Examples of the present disclosure thus relate to a lateral capacitive out-of-plane detection using asymmetrical electrodes. It is thereby possible to avoid ambiguities that can occur during a lateral capacitive out-of-plane detection using symmetrical electrodes, which, around the point of rest of the movable electrode, have a substantially quadratic response of the capacitance to a deflection x. A modification of the stationary electrode in one sensor element and of the movable electrode in a second capacitive sensor element makes it possible to shift the extremum toward a negative and positive deflection, respectively, by approximately the same absolute value a, $C1=\sim(x-a)^2$, $C2=\sim(x+a)^2$, as is shown in FIG. 3. It is thus possible to carry out an evaluation using a subtraction which makes it possible to achieve an increased linearity and which ideally leaves only a linear contribution, for example as the resulting output of a capacitive half-bridge or of a capacitive full-bridge.

Examples of the disclosure relate to corresponding sensors and sensor elements which have mutually laterally opposite electrodes for a capacitive detection and are producible by means of a cost-effective thin-film encapsulation. In examples, such a thin-film encapsulation can be implemented using a sacrificial carbon and a dielectric layer, as was described above. In other examples, other types of encapsulation can be used, for example wafer bonding and the like. Examples can be produced using monolithic microprocessing with a thin-film encapsulation. Other examples can be produced using a plurality of wafers, wherein for example the electrodes of the capacitive sensor elements can be produced in a first wafer, while a second wafer and a third wafer can serve as upper and lower covering.

A capacitive detection such as is carried out in examples of the present disclosure can have, by comparison with piezoresistive detection principles, lower thermal coefficients without a difficult resistance matching. In examples, the micromechanical sensor is a pressure sensor, for example a pressure sensor used in a tire pressure monitoring system. In examples, the micromechanical sensor is an acceleration sensor. Examples enable a virtually linear converter characteristic in order to enable signal extraction with high accuracy. Examples furthermore enable an acceleration detection in both a positive and a negative direction out of the securing plane (substrate plane) in order to enable securing both in tire rubber and in a valve. Examples comprise an integration of a corresponding micromechanical sensor with an in-plane acceleration detection element. Examples of the present disclosure generally enable a capacitive out-of-plane deflection detection with a linear characteristic up to large deflections.

In the examples described above, the cavity is formed below the electrodes using a silicon reflow technique (Venezia). However, the present disclosure is not restricted to such cavity formation. In other examples, the cavity can be implemented below the electrodes by means of other techniques, for example using sacrificial layers composed of SiGe or oxide, or etching back from the rear side. In examples, the cavity can also be formed by the bonding of a further substrate from the rear side.

In the examples described, the modification of the modified electrode was achieved in each case by reducing the extent of the electrode wall surface in the second direction. In other examples, the modification can be achieved by adding electrode wall surface, wherein the non-modified electrode then constitutes the electrode having the smaller extent in the second direction. Such an enlargement of the extent can be achieved for example by deposition of additional electrode material and structured etching-back. Consequently, the present disclosure is not restricted to such examples in which the smaller extent of one of the electrodes is achieved by a subtractive modification of the electrode having the smaller extent, but rather also encompasses such examples in which an additive modification of the electrode having the larger extent is effected.

The present disclosure is not restricted to specific mountings in particular of the movable electrode. In this respect, no specific details are indicated, rather all types of spring constructions can be used which yield a restoring force counteracting the deflection of the movable electrode from the rest position. In an area-efficient example, it is possible to use a seismic mass for an acceleration sensor or a deflectable membrane for a pressure sensor as movable electrode for both capacitive sensor elements. One such example was described above with reference to FIG. 19.

In examples of the present disclosure, the movable electrode itself can be designed as a seismic mass. In other examples, the movable electrode can be applied to a seismic mass.

Although evaluation circuits comprising a half-bridge circuit or a full-bridge circuit are described as examples, it is possible to use other evaluation circuits that form an output signal on the basis of the difference between the capacitances of the two sensor elements.

In the examples described, the sacrificial layer for the thin-film encapsulation is carbon. In other examples, other materials can be used as sacrificial material, which materials can be structured and selectively removed in order to open materials, such as e.g. oxide material, SiN material or Si material. Examples make this possible using a dry method in order to prevent sticking. In the examples described, the electrode material is a doped semiconductor material, in particular doped silicon. In other examples it is possible to use other conductive materials and suitable modifications of the mutually opposite electrodes. In other examples it is possible to use a nonconductive material with a suitable surface coating, once again with a suitable modification of the mutually opposite electrodes. In examples, for producing the cavity below the electrodes, an SOI substrate with local elimination of the buried oxide layer can be used instead of the method described. In other examples, it is possible to use an Si—SiGe—Si substrate with local SiGe removal, as is known for example from so-called "Silicon-on-Nothing" elements.

Although some aspects of the present disclosure have been described as features in association with a device, it is clear that such a description can likewise be regarded as a description of corresponding method features. Although some aspects have been described as features in association with a method, it is clear that such a description can also be regarded as a description of corresponding features of a device or of the functionality of a device.

In the detailed description above, in some instances various features in examples have been grouped together in order to rationalize the disclosure. This type of disclosure ought not be interpreted as the intention that the claimed examples have more features than are expressly indicated in each claim. Rather, as expressed by the following claims, the subject matter can reside in fewer than all features of an individual example disclosed. Consequently, the claims which follow are hereby incorporated in the detailed description, and each claim can stand as a distinct separate example. While each claim can stand as a distinct separate example, it should be noted that, although dependent claims in the claims refer back to a specific combination with one or more other claims, other examples also encompass a combination of dependent claims with the subject matter of any other dependent claim or a combination of each feature with other dependent or independent claims. Such combinations shall be encompassed, unless it is explained that a specific combination is not intended. Furthermore, it is intended that a combination of features of a claim with any other independent claim is also encompassed, even if this claim is not directly dependent on the independent claim.

The examples described above are merely illustrative of the principles of the present disclosure. It should be understood that modifications and variations of the arrangements and of the details described are evident to those skilled in the art. It is therefore intended that the disclosure is limited only by the appended patent claims and not by the specific details set out for the purpose of describing and explaining the examples.

What is claimed is:

1. A method for producing a micromechanical sensor element having a first electrode and a second electrode, wherein electrode wall surfaces of the first and the second electrodes are situated opposite one another in a first direction and form a capacitance, wherein a first one of the first electrode and the second electrode is movable in a second direction, which is different than the first direction, in response to a variable to be detected, and a second one of the first electrode and the second electrode is fixed, the method comprising:

producing a cavity in a semiconductor substrate, the cavity being closed by a doped semiconductor layer; and producing the first and the second electrodes in the doped semiconductor layer, including modifying the electrode wall surface of the first electrode in order to have a smaller extent in the second direction than the electrode wall surface of the second electrode, wherein modifying the electrode wall surface of the first electrode comprises forming a counterdoped region in the electrode wall surface of the first electrode in a part of the semiconductor layer which faces away from the cavity, and wherein the counterdoped region is adjacent to a remaining portion of the electrode wall surface of the first electrode.

2. The method as claimed in claim 1, wherein:

the counterdoped region comprises a first doping type that is different than a second doping type of the semiconductor layer, and the counterdoped region does not contribute to an active capacitor area of the first electrode.

* * * * *